US012666711B2

(12) United States Patent
Sung et al.

(10) Patent No.: US 12,666,711 B2
(45) Date of Patent: Jun. 23, 2026

(54) STACKED HYBRID TFET AND MOSFET

(71) Applicant: INTERNATIONAL BUSINESS MACHINES CORPORATION, Armonk, NY (US)

(72) Inventors: Min Gyu Sung, Latham, NY (US); Liqiao Qin, Albany, NY (US); Julien Frougier, Albany, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 408 days.

(21) Appl. No.: 18/323,559

(22) Filed: May 25, 2023

(65) Prior Publication Data

US 2024/0395814 A1      Nov. 28, 2024

(51) Int. Cl.
| | |
|---|---|
| *H10D 84/85* | (2025.01) |
| *H10D 30/01* | (2025.01) |
| *H10D 30/66* | (2025.01) |
| *H10D 64/23* | (2025.01) |
| *H10D 88/00* | (2025.01) |
| *H10D 89/10* | (2025.01) |

(52) U.S. Cl.
CPC ....... *H10D 84/856* (2025.01); *H10D 30/0295* (2025.01); *H10D 30/0297* (2025.01); *H10D 30/668* (2025.01); *H10D 64/256* (2025.01); *H10D 88/00* (2025.01); *H10D 89/10* (2025.01)

(58) Field of Classification Search
CPC ............. H10D 84/856; H10D 30/0295; H10D 30/0297; H10D 30/668; H10D 64/256; H10D 88/00; H10D 89/10; H10D 62/121; H10D 84/017; H10D 84/038; H10D 84/85
USPC ........................................................ 257/351
See application file for complete search history.

(56) References Cited

U.S. PATENT DOCUMENTS

| | | | |
|---|---|---|---|
| 8,415,209 B2 | 4/2013 | Rooyackers | |
| 9,653,585 B2 | 5/2017 | Zhang | |

(Continued)

OTHER PUBLICATIONS

Convertino, et al., "A hybrid III-V tunnel FET and MOSFET technology platform integrated on silicon," nature electronics, vol. 4, No. 2, 2021, pp. 162-170. Abstract Only. https://www.nature.com/articles/s41928-020-00531-3.

(Continued)

*Primary Examiner* — Mohammad M Hoque
(74) *Attorney, Agent, or Firm* — L. Jeffrey Kelly

(57) ABSTRACT

The present disclosure is directed to techniques of fabricating hybrid transistors that combine both TFETs and MOSFETs. The techniques may be commonly integrated such that TFET regions are formed in the same fabrication stages used to fabricate CMOS regions. The TFET and MOSFET may be stacked vertically to reduce the footprint area of the hybrid transistor, which may lead to further semiconductor IC device scaling. The hybrid transistor may utilize a backside power distribution network (BSPDN). The utilization of the BSPDN may reduce resistances, which may result in performance increases. Further, the utilization of the BSPDN may further reduce the footprint area of the hybrid transistor, which may provide for continued scaling. Further, the utilization of the BSPDN may further reduce signal and power potential routing complexities.

20 Claims, 24 Drawing Sheets

(56)     References Cited

U.S. PATENT DOCUMENTS

| | | | |
|---|---|---|---|
| 9,991,170 B2 | 6/2018 | Anderson et al. | |
| 10,840,352 B2 | 11/2020 | Rachmady | |
| 2016/0020305 A1* | 1/2016 | Obradovic | H10D 48/383 |
| | | | 438/157 |
| 2017/0005106 A1* | 1/2017 | Zhang | H10W 20/069 |
| 2020/0144260 A1* | 5/2020 | Do | H10D 84/85 |
| 2021/0384191 A1 | 12/2021 | Pillarisetty | |
| 2022/0301942 A1 | 9/2022 | Zota | |
| 2023/0275151 A1* | 8/2023 | Sharma | H10D 30/024 |
| | | | 257/288 |

OTHER PUBLICATIONS

Lu, et al., "Tunnel FET and MOSFET Hybrid Integrated 9T SRAM with Data-Aware Write Technique for Ultra-Low Power Applications," Published Oct. 20, 2022. 11 pages. Electronics, vol. 11, No. 20, 2022, 3392. https://www.mdpi.com/2079-9292/11/20/3392.

* cited by examiner

TFET and MOSFET on

TFET on

200

206

206

208

210

208

204

203

202

201

TFET on

TFET and MOSFET on

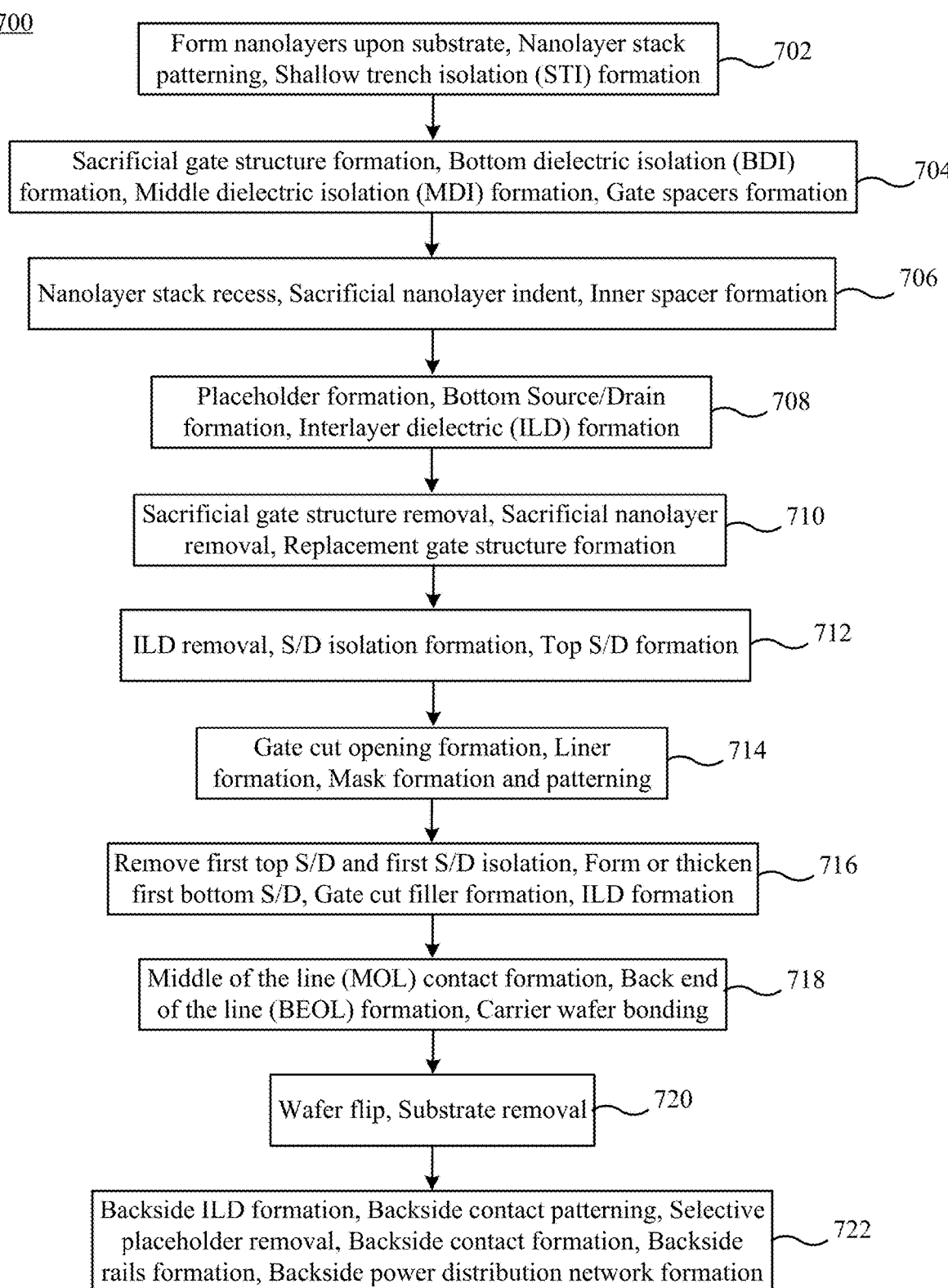

700

Form nanolayers upon substrate, Nanolayer stack patterning, Shallow trench isolation (STI) formation —702

Sacrificial gate structure formation, Bottom dielectric isolation (BDI) formation, Middle dielectric isolation (MDI) formation, Gate spacers formation —704

Nanolayer stack recess, Sacrificial nanolayer indent, Inner spacer formation —706

Placeholder formation, Bottom Source/Drain formation, Interlayer dielectric (ILD) formation —708

Sacrificial gate structure removal, Sacrificial nanolayer removal, Replacement gate structure formation —710

ILD removal, S/D isolation formation, Top S/D formation —712

Gate cut opening formation, Liner formation, Mask formation and patterning —714

Remove first top S/D and first S/D isolation, Form or thicken first bottom S/D, Gate cut filler formation, ILD formation —716

Middle of the line (MOL) contact formation, Back end of the line (BEOL) formation, Carrier wafer bonding —718

Wafer flip, Substrate removal —720

Backside ILD formation, Backside contact patterning, Selective placeholder removal, Backside contact formation, Backside rails formation, Backside power distribution network formation —722

FIG. 24

STACKED HYBRID TFET AND MOSFET

BACKGROUND

Various embodiments of the present disclosure generally relate to semiconductor integrated circuit (IC) device fabrication operations and resulting semiconductor IC devices. More specifically the various embodiments of the present disclosure relate to a stacked hybrid transistor that includes a tunneling field effect transistor (TFET) and a metal oxide semiconductor field effect transistor (MOSFET).

Conventional semiconductor IC devices, such as integrated circuits (ICs), or the like, incorporate planar field effect transistors (FETs) in which current flows through a semiconducting channel between a source and a drain, in response to a voltage applied to a control gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes.

One particular technology change entailed re-designing the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanowires, nanosheets, or the like, that are isolated from the substrate. In the GAA FET, channel surfaces are in respective contact with the source and drain and other respective channel surfaces are in contact with and surrounded by the gate.

A MOSFET is a type of metal oxide semiconductor field effect transistor that uses complementary and symmetrical pairs of p-type and n-type regions (e.g., source region and drain region) for logic functions. CMOS transistors are constructed in such a way that p-type metal oxide semiconductor (PMOS) transistors have either an input from a voltage source or from another PMOS transistor. Similarly, NMOS transistors have either an input from ground or from another NMOS transistor. The composition of a PMOS transistor creates low resistance between its source and drain contacts when a low gate voltage is applied and high resistance when a high gate voltage is applied. On the other hand, the composition of an NMOS transistor creates high resistance between source and drain when a low gate voltage is applied and low resistance when a high gate voltage is applied.

A TFET is a type of tunneling field effect transistor that is like a MOSFET except that the source and drain terminals of a TFET are doped of opposite material types. A common TFET structure consists of a p-type region, channel region, and n-type region junctions, in which the electrostatic potential of the channel region, which may hereinafter be referred to as a channel, is controlled by a gate. The TFET is operated by applying gate bias so that electron accumulation occurs in the channel for an n-type TFET. At sufficient gate bias, band-to-band tunneling (BTBT) occurs when the conduction band of the channel aligns with the valence band of the p-type region. Electrons from the valence band of the p-type region tunnel into the conduction band of the channel and current can flow across the device. As the gate bias is reduced, the bands become misaligned and current can no longer flow.

TFETs may be promising for low power applications and may be outperformed by MOSFETs in terms of speed and energy efficiency when high performance is required at higher drive voltages.

SUMMARY

In an embodiment of the present disclosure, a semiconductor integrated circuit (IC) device with a hybrid tunneling field effect transistor (TFET) and a complementary metal oxide semiconductor field effect transistor (MOSFET) is presented. The semiconductor IC device includes a bottom short source/drain (S/D) region, a top short S/D region, a tall S/D region, one or more bottom channels connected to the bottom short S/D region and the tall S/D region, and one or more top channels connected to the top short S/D region and the tall S/D region. The semiconductor IC device combines both a TFET and MOSFET which could enable low power and high-performance applications. The semiconductor IC device may be fabricated by introducing relatively different material types, so as to fabricate TFETs, within a complementary CMOS fabrication scheme. The TFET and MOSFET may be stacked vertically to reduce the footprint area of the hybrid transistor, which may lead to further semiconductor IC device scaling.

In an example, a shared gate is connected to the one or more bottom channels and is connected to the one or more top channels. The shared gate may control both the both the TFET and MOSFET. For example, when a low potential is applied to the shared gate, the MOSFET may be "off" and the TFET may be "on," such that current may flow therethrough. Further, when a high potential is applied to the shared gate the TFET and the MOSFET may be both "on" and current may flow through both the TFET and the MOSFET.

In an example, the top S/D region is vertically stacked and aligned above the bottom short S/D region. This vertical alignment may result from forming the bottom short S/D region and the top short S/D region within the same S/D recess in between adjacent gate structures.

In an example, the semiconductor IC device further includes a frontside back end of the line (BEOL) network and a backside power distribution network (BSPDN). The frontside BEOL network may be used for signal routing or, in other words, include signal lines and the BSPDN may be used for power routing, or in other words, include power rails. In this manner signal lines and power rails may be substantially separated and routing complexities within the semiconductor IC device may be reduced which may lead to further device scaling.

In an example, the semiconductor IC device further includes a first frontside contact that directly connects the top short S/D region to the frontside BEOL network, a second frontside contact that directly connects the tall S/D region to the frontside BEOL network, and a backside contact that directly connects the bottom short S/D region to the BSPDN. In this example, the tall S/D region may be connected to a frontside contact which may reduce routing complexities within the within the semiconductor IC device and may lead to further device scaling.

In an example, the semiconductor IC device further includes a frontside contact that directly connects the top short S/D region to the frontside BEOL network, a first backside contact that directly connects the bottom short S/D region to the BSPDN, and a second backside contact that directly connects the tall S/D region to the BSPDN. In this example, the tall S/D region may be connected to a backside contact which may reduce routing complexities within the semiconductor IC device and may lead to further device scaling.

In an example, the semiconductor IC device further includes a S/D isolator between the top short S/D region and the bottom short S/D region. The S/D isolator may adequately electrically isolate the short S/D region and the bottom short S/D region for proper or efficient device performance.

In an example, the semiconductor IC device further includes a middle dielectric isolation between the one or more bottom channels and the one or more top channels. The middle dielectric isolation may increase device reliability by further electrically isolating the TFET and the MOSFET. In this example, the middle dielectric isolation may be directly connected to the S/D isolator and to the tall S/D region.

In an example, a threshold voltage of the TFET is less than a threshold voltage of the MOSFET. As such, when a low potential is applied to the shared gate the TFET may be on and current may flow therethrough and when a high potential is applied to the shared gate the TFET and the MOSFET may be both on and current may flow through the TFET and the MOSFET.

In an example, the one or more bottom channels comprise one or more first nanolayer(s) and the one or more top channels comprise one or more second nanolayer(s). Utilizing nanolayer(s) for channels may lead to further device scaling.

In an example, the bottom short S/D region is composed of an n-type material, the top short S/D region is composed of a p-type material, and the tall S/D region is composed of an n-type material. In this example, a n-type TFET may be fabricated. As such, a hybrid transistor which includes a TFET and MOSFET is provided which could enable low power and high-performance applications. The hybrid transistor may be fabricated by introducing relatively different material types, so as to fabricate TFETs, within a complementary CMOS fabrication scheme.

In an example, the bottom short S/D region is composed of an p-type material, the top short S/D region is composed of a n-type material, and the tall S/D region is composed of an p-type material. In this example, a p-type TFET may be fabricated. As such, a hybrid transistor which includes a TFET and MOSFET is provided which could enable low power and high-performance applications. The hybrid transistor may be fabricated by introducing relatively different material types, so as to fabricate TFETs, within a complementary CMOS fabrication scheme.

In an example, a top surface of the top short S/D region is coplanar with a top surface of the tall S/D region. The coplanarity of these regions may increase fabrication reliability (e.g., frontside contacts may be more geometrically similar), which may increase yields.

In another embodiment of the present disclosure, a method to fabricate a semiconductor integrated circuit (IC) device is presented. The method includes forming a first bottom source/drain (S/D) region composed a first material type and a second bottom S/D region composed of the first material type, forming a first top S/D region composed of a second material type above the first bottom S/D region and forming a second top S/D region composed of the second material type above the second bottom S/D region, removing the second top S/D region and exposing the second bottom S/D region, and enlarging the second bottom S/D region. The semiconductor IC device fabrication method combines both a TFET and MOSFET which could enable low power and high-performance applications. The semiconductor IC device fabrication method introduces relatively different material types, so as to fabricate TFETs, within a complementary CMOS fabrication scheme. The TFET and MOSFET may be stacked vertically to reduce the footprint area of the hybrid transistor, which may lead to further semiconductor IC device scaling.

In an example, the one or more bottom channels are connected to the first bottom S/D region and the enlarged S/D region and wherein one or more top channels are connected to the first top S/D region and the enlarged S/D region. In this way, the TFET and MOSFET may be stacked vertically to reduce the footprint area of the hybrid transistor, which may lead to further semiconductor IC device scaling.

In an example, the method further includes forming a shared gate around the one or more bottom channels and around the one or more top channels. The shared gate may allow to control both the both the TFET and MOSFET. For example, when a low potential is applied to the shared gate the TFET may be on and current may flow therethrough and when a high potential is applied to the shared gate the TFET and the MOSFET may be both on and current may flow through the TFET and the MOSFET.

In another embodiment of the present invention, a hybrid transistor is presented. The hybrid transistor includes a tunneling field effect transistor (TFET) stacked above a complementary metal oxide semiconductor field effect transistor (MOSFET). The MOSFET includes a bottom short source/drain (S/D) region and the TFET includes a top short S/D region. The MOSFET and the TFET further includes a shared tall S/D region. The hybrid transistor combines both a TFET and MOSFET which could enable low power and high-performance applications. The TFET and MOSFET are stacked vertically to reduce the footprint area of the hybrid transistor, which may lead to further semiconductor IC device scaling.

In an example, the MOSFET further includes one or more bottom channels connected to the bottom short S/D region and the shared tall S/D region and the TFET further includes one or more top channels connected to the top short S/D region and the tall shared S/D region. In this way, the TFET and MOSFET may be stacked vertically to reduce the footprint area of the hybrid transistor, which may lead to further semiconductor IC device scaling.

In an example, the MOSFET further comprises and the TFET further comprises a shared gate connected to the one or more bottom channels and connected to the one or more top channels. The shared gate may control both the both the TFET and MOSFET. For example, when a low potential is applied to the shared gate, the MOSFET may be "off" and the TFET may be "on," such that current may flow therethrough. Further, when a high potential is applied to the shared gate the TFET and the MOSFET may be both "on" and current may flow through both the TFET and the MOSFET.

These and other embodiments, features, aspects, and advantages will become better understood with reference to the following description, appended claims, and accompanying drawings.

BRIEF DESCRIPTION OF THE DRAWINGS

FIG. 24 depicts a flow diagram illustrating a semiconductor IC device fabrication method to fabricate a semiconductor IC device that includes a stacked TFET and a MOSFET, in accordance with one or more embodiments of the disclosure.

DETAILED DESCRIPTION

Embodiments are disclosed with the understanding that hybrid transistors that combine both TFETs and MOSFETs could enable low power and high-performance applications but will likely require co-integration of different material types, to fabricate TFETs, within a complementary CMOS fabrication scheme. The present disclosure is directed to techniques of fabricating hybrid transistors that combine both TFETs and MOSFETs. The techniques may be commonly integrated such that TFET regions are formed in the same fabrication stages used to fabricate CMOS regions. The TFET and MOSFET may be stacked vertically to reduce the footprint area of the hybrid transistor, which may lead to further semiconductor IC device scaling.

The hybrid transistor may utilize a backside power distribution network (BSPDN). The utilization of the BSPDN may reduce resistances through the hybrid transistor, which may result in semiconductor IC device performance increases. Further, the utilization of the BSPDN may further reduce the footprint area of the hybrid transistor relative to other hybrid MOSFET and TFET hybrid circuits that utilize only respective frontside contacts, which may provide for continued semiconductor IC device scaling. Further, the utilization of the BSPDN may further reduce signal and power potential routing complexities to the respective regions in the MOSFET and TFET.

Figure 1B:
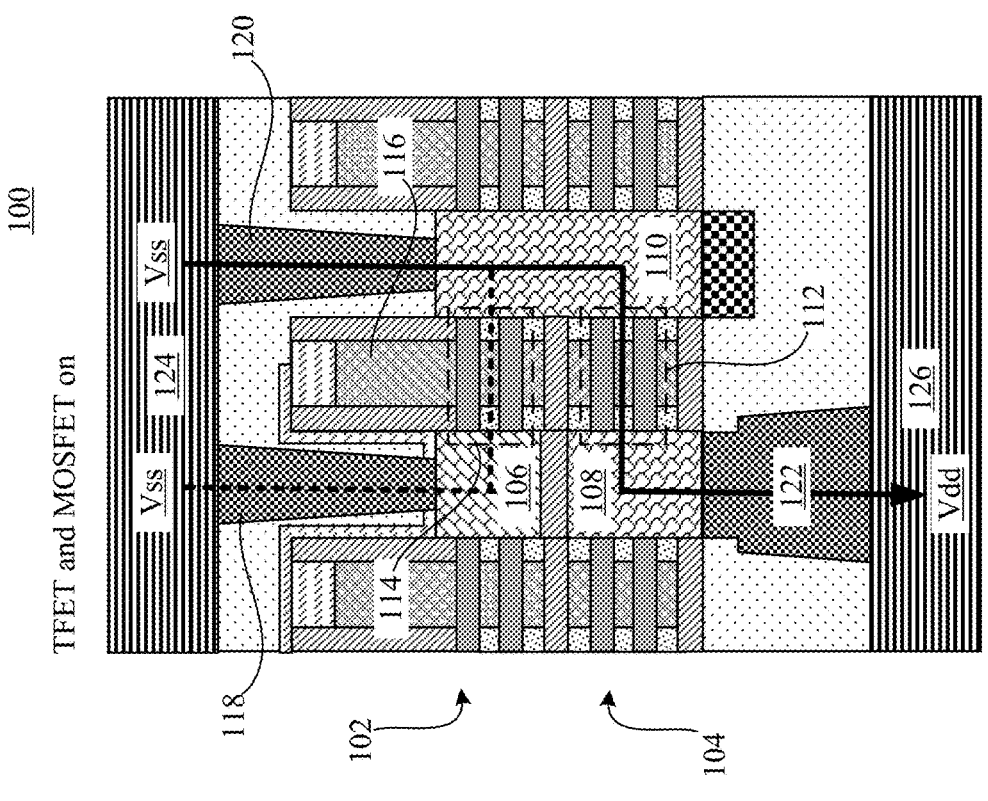
FIG. 1A and FIG. 1B depict a semiconductor IC device that includes a stacked TFET and a MOSFET, in accordance with one or more embodiments of the disclosure.
Figure 1B:
Figure 1A:
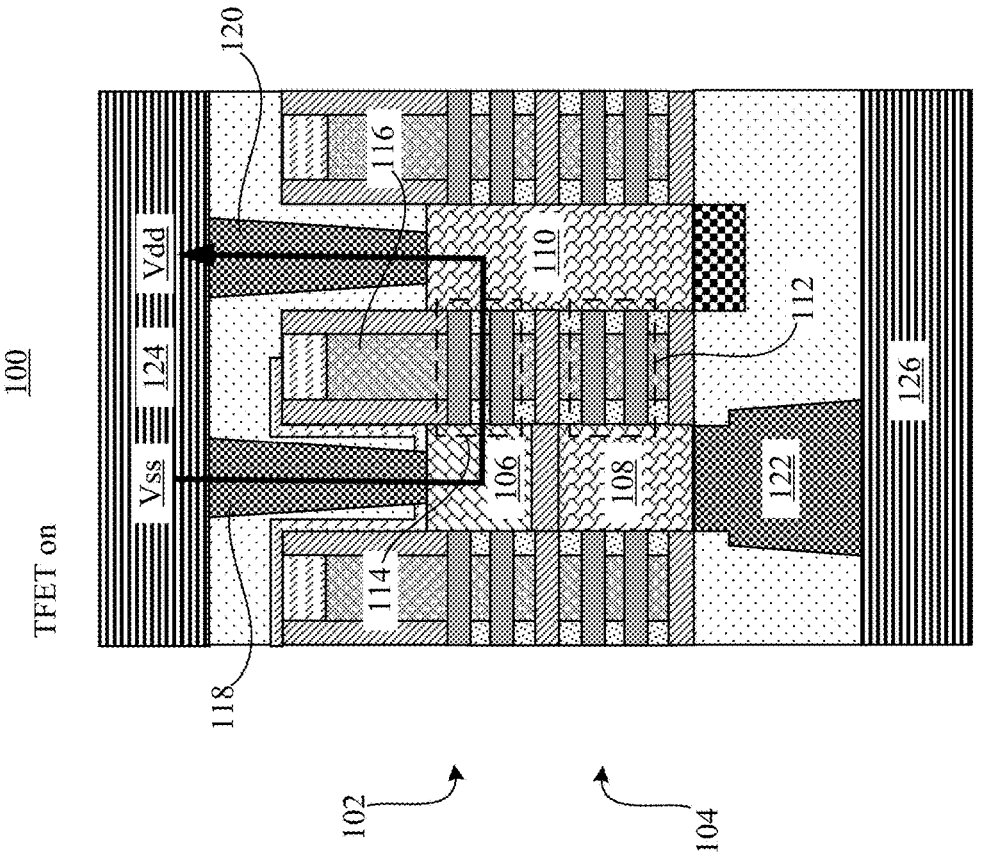

FIG. 1A and to FIG. 1B depicts a semiconductor IC device 100 that includes a TFET 102 and a MOSFET 104, in accordance with one or more embodiments of the disclosure. The TFET 102 includes a p-type source/drain (S/D) 106 and a channel region 114. The MOSFET 104 includes a n-type S/D 108 and a channel region 112. The TFET 102 and the MOSFET 104 share the same n-type S/D 110. In other words, both the channel region 114 and the channel region 112 are connected to the same n-type S/D 110. Similarly, TFET 102 and the MOSFET 104 may share the same gate 116. That is, both the channel region 114 and the channel region 112 may be connected to the same gate 116.

The p-type S/D 106 is a different material type (p-type versus n-type) relative to the n-type S/D 110. Similarly, the n-type S/D 108 is the same material type relative to the n-type S/D 110. The p-type S/D 106 and the n-type S/D 108 may be vertically stacked (e.g., the p-type S/D 106 is above the n-type S/D 108, as depicted). The p-type S/D 106 and the n-type S/D 108 may be vertically stacked and aligned (i.e., the p-type S/D 106 is above the n-type S/D 108 and shares the same vertical bisector, as depicted). A S/D isolator may be between the p-type S/D 106 and the n-type S/D 108. The S/D isolator may adequately electrically isolate the p-type S/D 106 from the n-type S/D 108, and/or vice versa.

The semiconductor IC device 100 may further include a frontside contact 118, a frontside contact 120, a backside contact 122, a frontside back end of the line (BEOL) network 124, and/or a BSPDN 126. The frontside contact 118 may directly connect the frontside BEOL network 124 to the p-type S/D 106. The frontside contact 120 may directly connect the frontside BEOL network 124 to the n-type S/D 110. The backside contact 122 may directly connect the BSPDN 126 to the n-type S/D 108. Generally, a threshold voltage of TFET 102 may be less than a threshold voltage of MOSFET 104.

FIG. 1A depicts exemplary current flow through the TFET 102 when a relatively low potential is applied to the gate 116. In this example, when the relatively low potential is applied to the gate 116, current may not flow through the MOSFET 104 and may solely flow through the TFET 102. In the depicted example, the frontside contact 118 may be at Vss potential and the frontside contact 120 may be at Vdd potential.

FIG. 1B depicts exemplary current flow through the MOSFET 104 when a relatively high potential is applied to the gate 116. In a particular example, when the relatively high potential is applied to the gate 116, current may flow through both the TFET 102 (shown by the dashed line) and through the MOSFET 104 (shown by the continuous line). In the depicted example, the frontside contact 118 may be at Vss potential, the frontside contact 120 may be at Vss potential, and the backside contact 122 may be at Vdd potential.

This exemplary semiconductor IC device 100 combines both TFET 102 and MOSFET 104 and could enable low power and high-performance applications. The fabrication of TFET 102 fits within MOSFET fabrication stages and may therefore reduce fabrication complexities of semiconductor IC device 100. The TFET 102 and MOSFET 104 may be stacked vertically to reduce the footprint area of the hybrid transistor, which may lead to semiconductor IC device 100 scaling.

Further, the utilization of the BSPDN 126 and backside contact 122 may reduce the footprint area of the hybrid transistor, compared to a similar hybrid transistor which only includes frontside contacts, which may provide for continued semiconductor IC device 100 scaling. Further, the utilization of the BSPDN 126 and the BEOL network 124 may effectively or adequately separate signal lines from power rails and may therefore reduce signal and power potential routing complexities to respective one or more of the p-type S/D 106, the n-type S/D 108, the n-type S/D 110, and/or the gate 116, relative to a semiconductor IC device that does not utilize a BSPDN.

Although this detailed description includes examples of how embodiments of the disclosure can be implemented to form an exemplary semiconductor IC device with GAA FETs, implementation of the teachings recited herein are not necessarily limited to a particular type of FET structure or combination of materials depicted or described. Rather, embodiments of the present disclosure are capable of being implemented in conjunction with other transistor types or materials, now known or later developed, wherein it is desirable for the semiconductor IC device to include a hybrid transistor with a TFET and a MOSFET, according to one or more disclosed embodiments.

For the sake of brevity, conventional techniques related to semiconductor IC device fabrication may or may not be described in detail herein. Moreover, the various tasks and process steps described herein can be incorporated into a more comprehensive procedure or process having additional steps or functionality not described in detail herein. Various steps in the manufacture of semiconductor IC devices are well known and so, in the interest of brevity, many conventional steps will only be mentioned briefly herein or will be omitted entirely without providing the well-known process details.

In general, the various processes used to form a semiconductor IC device that will be packaged into a final or packaged IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present disclosure, transistors are a type of microdevice commonly found in a wide variety of semiconductor IC devices. Typical semiconductor IC devices may be formed using or within active regions of a wafer. The active regions are defined by isolation or diffusion break regions used to separate and electrically isolate the adjacent active regions. In these typical IC devices, it may be difficult to form a through device connection in these isolation or diffusion break regions.

An exemplary semiconductor IC device includes a plurality of GAA FETs. Each GAA FET has a source and a drain that are formed in an active region of a semiconductor layer by implanting n-type or p-type impurities in the respective source and the drain material. Disposed between the source and the drain is a channel, intrinsic, or body region, hereinafter referred collectively as a channel. Disposed around the channel is the gate. The gate and the source and the gate and the drain are spaced apart by a dielectric layer or spacer.

The exemplary hybrid transistor may be fabricated using so-called complementary metal oxide semiconductor (CMOS) fabrication technologies, even though the hybrid transistor includes the TFET. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of a GAA FET is related to the electrical conductivity of the channel material. If the channel material has a relatively high conductivity, the GAA FET can be made with a correspondingly smaller wafer footprint. A known method of increasing channel conductivity and decreasing GAA FET size is to form the channel as a nanolayer, such as a nanowire, or nanosheet. These GAA FETs provide a relatively small FET footprint by forming the channel as a series of vertical nanolayers.

In a known GAA configuration, a nanolayer-based FET includes a source region, a drain region, and stacked nanolayer channels between the source and drain regions. A gate surrounds the stacked nanolayer channels and regulates electron and hole flow through the nanolayer channels between the source and drain regions. GAA FETs may be fabricated by forming alternating layers of channel nanolayer and sacrificial nanolayer layers. The sacrificial nanolayer layers are released from the channel nanolayers before the GAA FET device is finalized. For n-type GAA FETs, the channel nanolayer layers may be silicon (Si) and the sacrificial nanolayer layers may be silicon germanium (SiGe). For p-type GAA FETs, in some implementations, the channel nanolayer layers may be SiGe and the sacrificial nanolayer layers may be Si. In other implementations, p-type GAA FETs, the channel nanolayer may be Si, and the sacrificial nanolayer can be SiGe. In some implementations, the channel nanolayer layers may initially be Si and can be converted to SiGe or other material, after sacrificial nanolayer layers are removed.

Turning now to a more detailed description of fabrication operations and resulting structures according to embodiments of the disclosure, FIG. 2 through FIG. 20 depict a semiconductor IC device 200 device that includes, or is to include, a hybrid transistor with the MOSFET and the TFET, after various fabrication operations. For ease of illustration, the fabrication operations depicted therein will be described in the context of forming elements of GAA FET(s). The cross-sectional structural diagrams depicted in the drawings are two-dimensional, through the semiconductor IC device 200 is a three-dimensional device. The depicted cross-sectional planes are chosen to best show the features of the semiconductor IC device 200. For example, as depicted in FIG. 3, an X cross-sectional view and a Y cross-sectional view are defined upon a partial top-view of semiconductor IC device 200. The exemplary X cross-sectional view is a vertical cross-section through an active region across neighboring gates and the exemplary Y cross-sectional view is a vertical cross-section through a gate across neighboring active regions.

For clarity, the exemplary fabrication stages depicted in FIG. 2 through FIG. 20 may be used to fabricate the various semiconductor IC devices depicted and described herein. For example, the fabrication stages depicted in FIG. 2 through FIG. 20 may be used to also fabricate semiconductor IC device 100, semiconductor IC device 400, exemplarily depicted in FIG. 21A and in FIG. 21B, semiconductor IC device 500, exemplarily depicted in FIG. 22A and in FIG. 22B, and semiconductor IC device 600, exemplarily depicted in FIG. 23A and in FIG. 23B.

Figure 2:
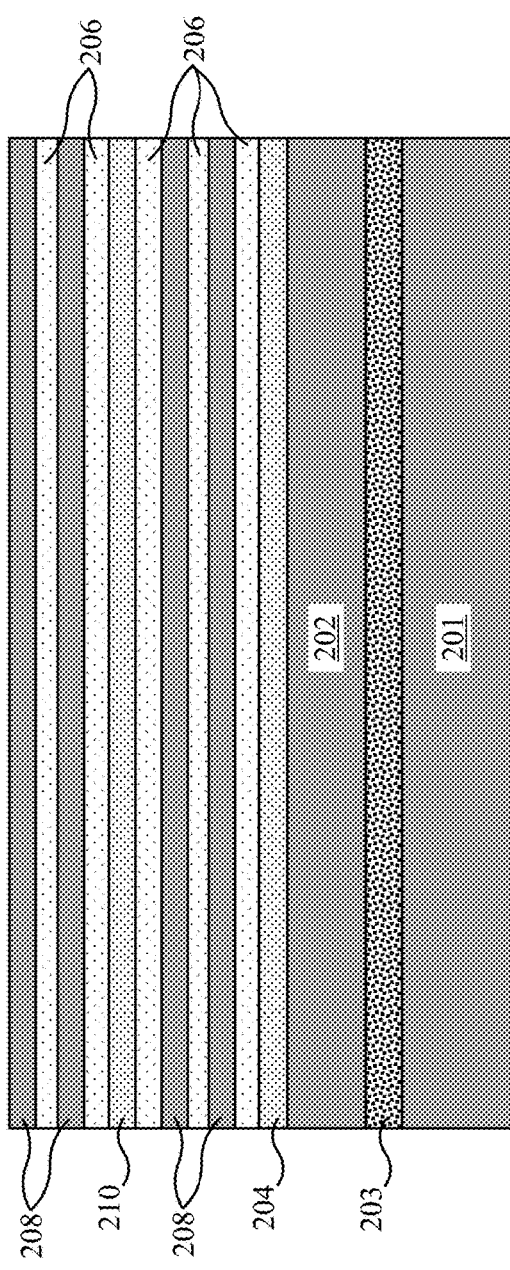
FIG. 2 through FIG. 20 depict fabrication stage views of a semiconductor IC device that is to include or does include a stacked TFET and a MOSFET, in accordance with one or more embodiments of the disclosure.
Figure 3:
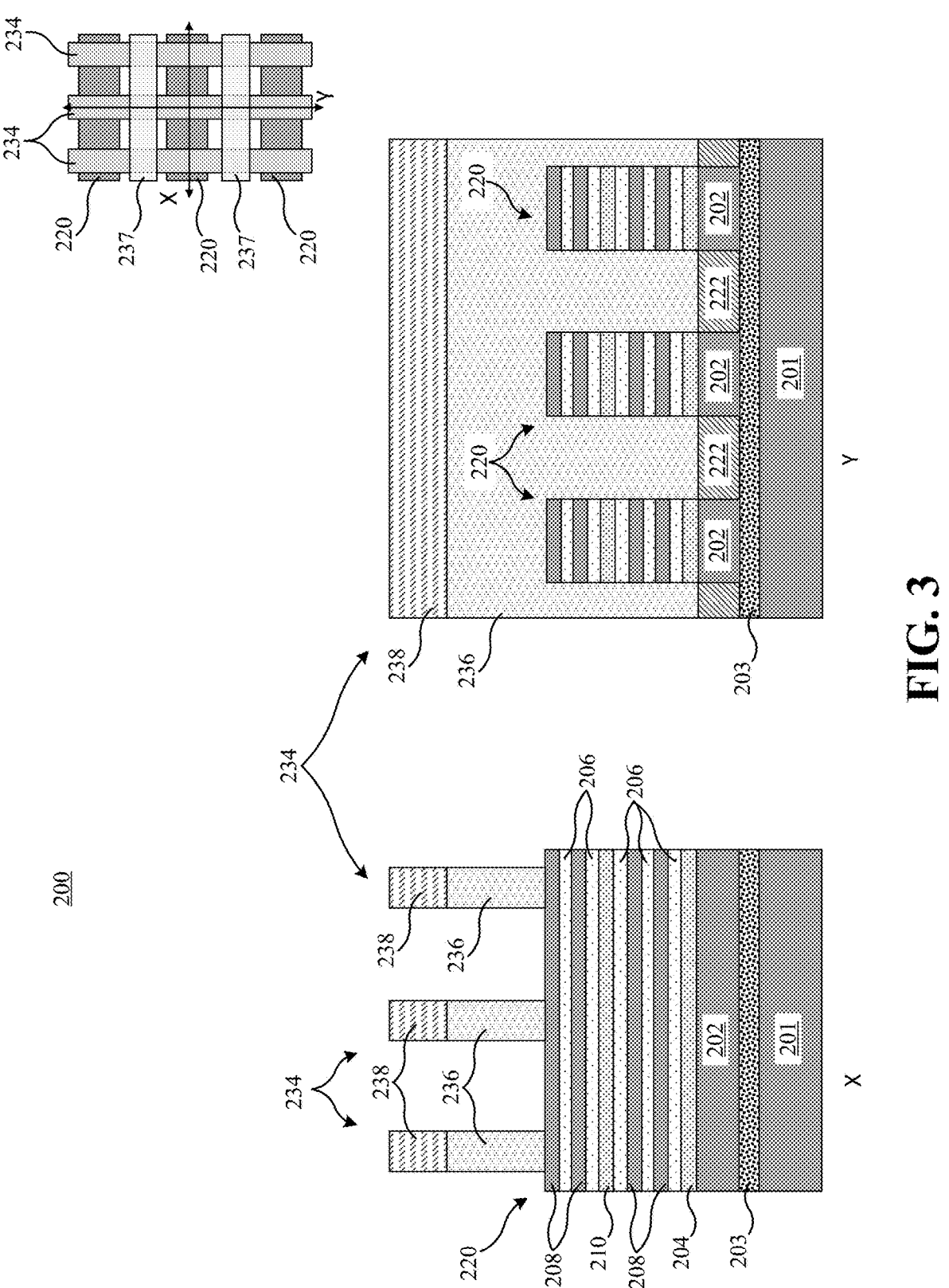

FIG. 2 depicts a cross-sectional view of the semiconductor IC device 200 after initial fabrication operations, in accordance with embodiments of the present disclosure. In the present fabrication stage, one or more nanolayers are formed upon a substrate.

The substrate may include a multilayered substrate that includes an upper substrate 202 and a lower substrate 201. An etch stop layer 203 may be located between the upper substrate 202 and the lower substrate 201. The etch stop layer 203 is generally formed of a material with etch selectivity to upper substrate 202 and/or lower substrate 201.

Non-limiting examples of suitable materials for the upper substrate 202 and/or lower substrate 201 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

A bottom sacrificial nanolayer 204 may be formed upon the upper substrate 202. The bottom sacrificial nanolayer 204 may be formed by epitaxially growing a SiGe layer with high Ge %, ranging from 50% to 70%. In some embodiments, the bottom sacrificial nanolayer 204 is formed of a material with etch selectivity to the material of sacrificial nanolayers 206 and to the material of active nanolayers 208, there above, such that the bottom sacrificial nanolayer 204 can be selectively removed without also removing the sacrificial nanolayers 206 and active nanolayers 208, and/or vice versa. The bottom sacrificial nanolayer 204 can have a thickness of, for example, from about 4 to about 15 nm.

In an implementation, the bottom sacrificial nanolayer 204 may be epitaxially grown from the upper substrate 202. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or formation," or the like, is defined herein as the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on other exposed surfaces, such as silicon dioxide or silicon nitride surfaces.

A first series of nanolayers may be fabricated by forming an alternating series of sacrificial nanolayers 206, such as SiGe sacrificial nanolayers, and active nanolayers 208, such as Si nanolayers, upon the bottom sacrificial nanolayer 204. The sacrificial nanolayers 206 can have Ge % ranging from 20% to 45%. In an implementation, the bottom most sacrificial nanolayer 206 may be epitaxially grown from the bottom sacrificial nanolayer 204 and the alternating active nanolayer 208 and sacrificial nanolayer 206 may be formed by epitaxially growing one layer and then the next until the desired number and desired thicknesses of the layers are achieved. Any number of alternating nanolayers can be provided within the first series of nanolayers.

In some embodiments, the active nanolayers 208 are formed from Si and can include, for example, monocrystalline Si. The active nanolayers 208 can have a thickness of, for example, from about 4 to about 12 nm. In embodiments the sacrificial nanolayers 206 are formed from SiGe and the sacrificial nanolayers 206 can have a thickness of, for example, from about 4 to about 12 nm. The sacrificial nanolayers 206 can have Ge % ranging from 20% to 45%. In some embodiments, the sacrificial nanolayers 206 are formed of a material that is sufficiently different from the active nanolayers 208, such that the sacrificial nanolayers 206 can be selectively removed without also removing the active nanolayers 208, and/or vice versa.

A middle sacrificial nanolayer 210 may be formed upon the first series of nanolayers. The middle sacrificial nanolayer 210 may be formed by epitaxially growing a SiGe layer with high Ge %, ranging from 50% to 70% upon the topmost sacrificial nanolayer 206 within the first series of nanolayers. In some embodiments, the middle sacrificial nanolayer 210 is the same material relative to bottom sacrificial nanolayer 204. The middle sacrificial nanolayer 210 is formed of a material that is sufficiently different from the sacrificial nanolayers 206 and active nanolayers 208, there above and/or there below, such that the middle sacrificial nanolayer 210 can be selectively removed without also removing the sacrificial nanolayers 206 and active nanolayers 208, and/or vice versa. The middle sacrificial nanolayer 210 can have a thickness of, for example, from about 4 to about 15 nm.

Next, a second series of nanolayers may be fabricated by forming an alternating series of sacrificial nanolayers 206, such as SiGe sacrificial nanolayers, and active nanolayers 208, such as Si nanolayers, upon the middle sacrificial nanolayer 210. In an implementation, the bottom most sacrificial nanolayer 206 of the second series of nanolayers may be epitaxially grown from the middle sacrificial nanolayer 210 and the alternating active nanolayers 208 and sacrificial nanolayers 206 may be formed by epitaxially growing one layer and then the next until the desired number and desired thicknesses of the layers are achieved. Any number of alternating nanolayers can be provided within the second series of nanolayers.

FIG. 3 depicts cross-sectional views of semiconductor IC device 200 shown after exemplary fabrication operation(s), in accordance with one or more embodiments. In the depicted fabrication stage, the nanolayers are patterned into one or more nanolayer stacks 220, one or more shallow trench isolation (STI) regions 222 adjacent to the one or more nanolayer stacks, and one or more sacrificial gate structures 234 are formed upon the STI regions 222 and are formed upon and around the one or more sacrificial gate structures 234.

The one or more nanolayer stacks 220 may be patterned by forming a mask layer (not shown) that may be used to pattern the nanolayers into nanolayer stacks 220, upon the top nanolayer. The mask layer may be patterned by photolithography which resultantly exposes portions of the underlying top nanolayer while protects other portions of the underlying nanolayers.

The one or more nanolayer stacks 220 may be patterned by removing respective undesired portion(s) or section(s) of the sacrificial nanolayers while retaining respective desired portions thereof. The retained portions of the nanolayers may effectively define respective active regions within the semiconductor IC device 200. The removal of undesired portions of the nanolayers can be accomplished using, for example, etch processes. The desired portions of the nanolayers may be protected by the patterned mask layer and resultingly form the one or more nanolayer stacks 220.

The removal of such undesired nanolayer portions may further be associated with the removal of undesired portions of upper substrate 202 down to the etch stop layer 203 that are adjacent to respective footprints of nanolayer stacks 220.

Further in the present fabrication stage, one or more STI regions 222 may be formed upon the etch stop layer 203 and upon the substrate 202 generally below and adjacent to the nanolayer stacks 220. For example, the one or more STI regions 222 may be formed by depositing isolation material within the recessed substrate 202 adjacent to the one or more nanolayer stacks 220. In the embodiment depicted, a top surface of the one or more STI regions 222 may be coplanar with a top surface of substrate 202. STI region(s) 222 may be formed by depositing isolation material upon the etch stop layer 203 and the upper substrate 202 to a thickness such that the top surface of the isolation material is above the upper substrate 202, followed by STI dielectric material etch back, recess, or the like. The one or more STI regions 222 may electrically isolate components or features of neighboring transistors, or the like, and/or may electrically isolate neighboring active regions or active devices.

Further, in the depicted fabrication stage, one or more sacrificial gate structures 234 are formed upon the one or more STI regions 222 and upon and around the one or more nanolayer stacks 220. The one or more sacrificial gate structures 234 may include a sacrificial gate liner (not shown), a sacrificial gate 236, and a sacrificial gate cap 268. The sacrificial gate structures 234 may be formed by depositing a sacrificial gate liner layer (e.g., a dielectric, oxide, or the like) upon the one or more STI regions 222 and upon and around the one or more nanolayer stacks 220. The sacrificial gate structures 234 may further be formed by subsequently depositing a sacrificial gate layer (e.g., amorphous silicon, or the like) upon the sacrificial gate liner layer. The thickness of the sacrificial gate layer may be such that the top surface of the sacrificial gate layer is above the top surface of the one or more nanolayer stacks 220. The sacrificial gate structure 134 may further be formed by forming a gate cap layer upon the sacrificial gate layer. The gate cap layer may be formed by depositing a mask material, such as a hard mask material, such as silicon nitride, silicon oxide, combinations thereof, or the like, upon the sacrificial gate layer. The gate cap layer may be composed of one or more layers of masking materials to protect the sacrificial gate layer and/or other underlying materials during subsequent processing of semiconductor IC device 200.

The one or more sacrificial gate structures 234 may further be formed by patterning the gate cap layer, sacrificial gate layer, and sacrificial gate liner by, for example, using lithography and etch processes to remove undesired portions and retain desired portion(s), respectively. The retained desired portion(s) of the gate cap layer, sacrificial gate layer, and sacrificial gate liner may form the sacrificial gate liner (not shown), the sacrificial gate 236, and the sacrificial gate cap 268, respectively, of each of the one or more sacrificial gate structures 234.

One or more sacrificial gate structures 234 can be formed on targeted regions or areas of semiconductor IC device 200 to define the length of one or more GAA FETs, length of one or more CMOS FET channels, length of one or more TFET channel regions, or the like, and to provide sacrificial material for yielding targeted GAA FET structure(s) in subsequent processing. According to an example, each sacrificial gate structure 234 can have a height of between approximately 50 nm and approximately 200 nm, and a length of between approximately 10 nm and approximately 200 nm.

As depicted in the Y cross-section, the one or more of the sacrificial gate structures 234 can be formed upon respective top, front, and rear sides (e.g., out of the front of the paper, out of the back of the paper) of the one or more nanolayer stacks 220, as depicted.

For clarity, one or more gate cut regions 237 are shown in the top-down view of FIG. 3. A gate cut fill 286, exemplarity depicted in the Y cross-section view of FIG. 14, may be formed within each of the one or more gate cut regions 237.

Figure 4:
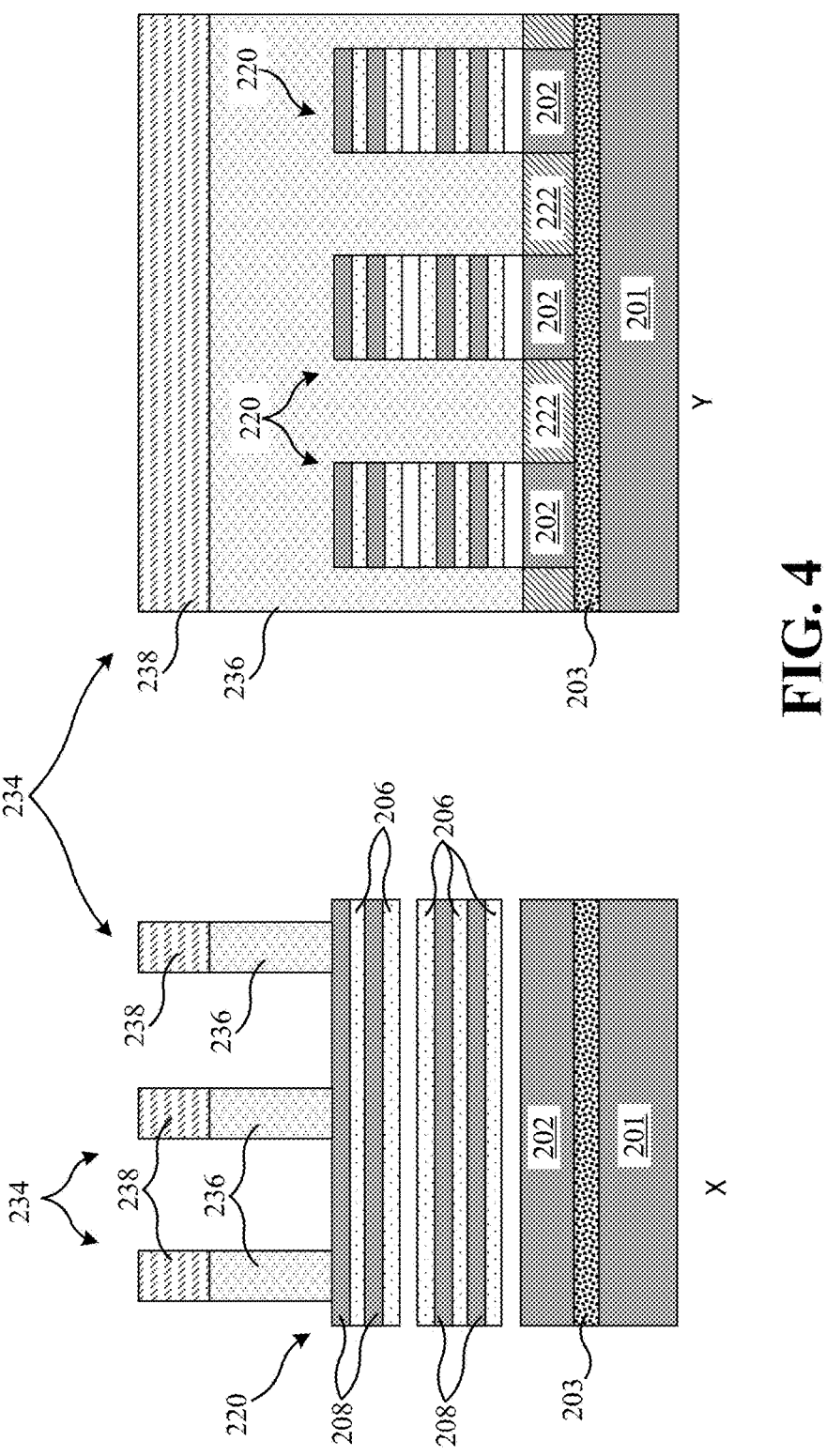

FIG. 4 depicts cross-sectional views of semiconductor IC device 200 shown after exemplary fabrication operation(s), in accordance with one or more embodiments. In the depicted fabrication stage, bottom sacrificial nanolayer 204 and middle sacrificial nanolayer 210 are removed.

The bottom sacrificial nanolayer 204 and the middle sacrificial nanolayer 210 may be removed by a selective removal technique, such as a selective etch. That is, the bottom sacrificial nanolayer 204 and the middle sacrificial nanolayer 210 may be removed without also removing the sacrificial nanolayers 206, nanolayers 208, the one or more sacrificial gate structures 234, and/or the one or more STI regions 222. Upon the removal of the bottom sacrificial nanolayer 204 and the middle sacrificial nanolayer 210, the first series of nanolayers and the second series of nanolayers may be adequately structurally supported by the one or more sacrificial gate structures 234.

Figure 5:
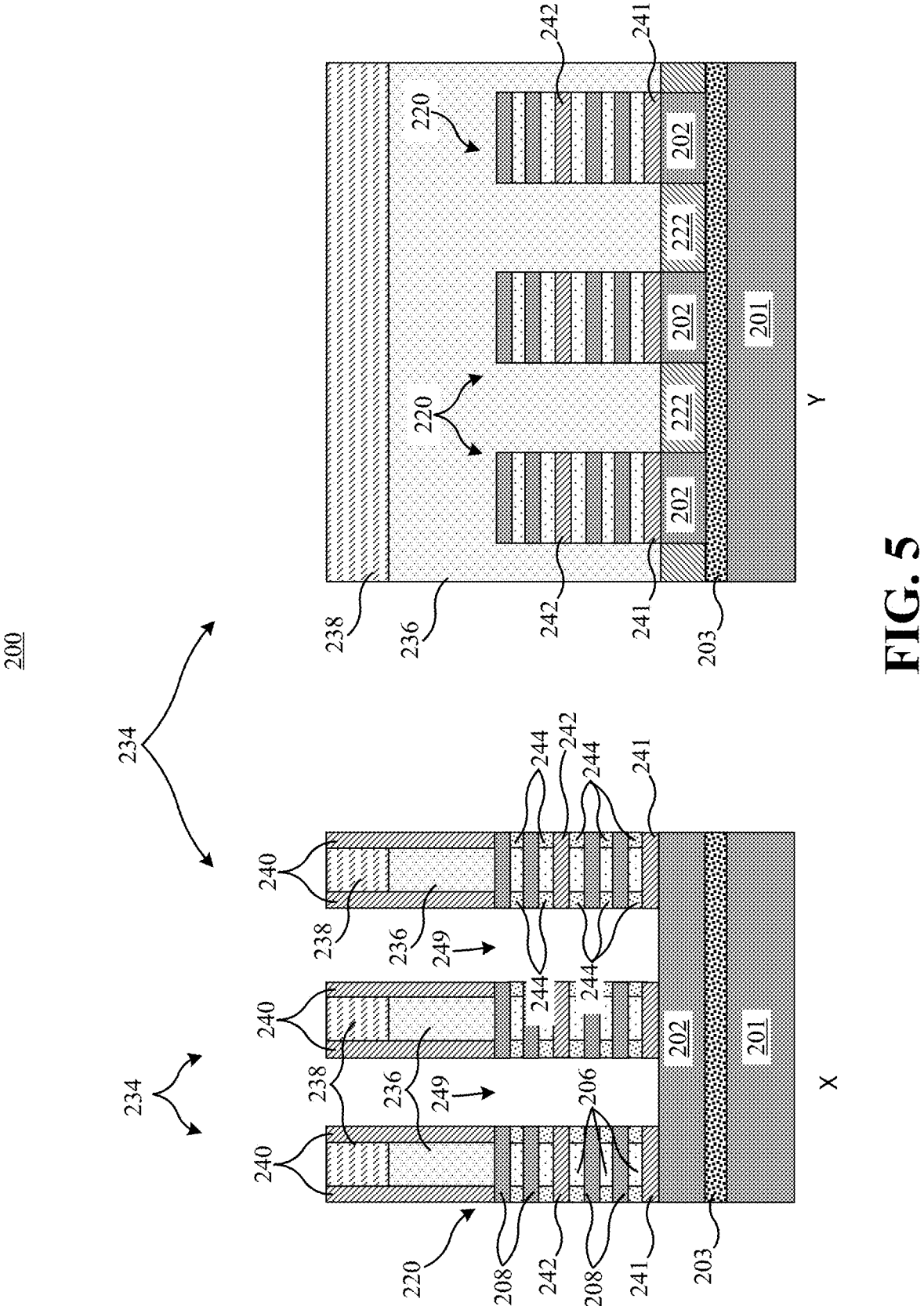

FIG. 5 depicts cross-sectional views of semiconductor IC device 200 shown after exemplary fabrication operation(s), in accordance with one or more embodiments. In the depicted fabrication stage, one or more spacers 240 are formed, a bottom dielectric isolation 241 is formed, and a middle dielectric isolation 214 is formed. Further, in the depicted fabrication stage, source/drain (S/D) recesses 249 are formed within the one or more nanolayer stacks 220 between spacers 240 that are associated with neighboring sacrificial gate structures 234, thereby dicing or separating the one or more nanolayer stacks 220. Further in the depicted fabrication stage, sacrificial nanolayers 206 within the one or more nanolayer stacks 220 may be indented, thereby forming an indent void underneath the one or more spacers 240, and a respective inner spacer 244 may be formed within each respective indent void.

Each of the one or more spacers 240 may be respectively formed upon the one or more STI regions 222, may be respectively formed upon and around the one or more nanolayer stacks 220, and may be formed upon and around the one or more sacrificial gate structures 234. In one example, spacers 240 may be formed of a dielectric material(s), such as such as silicon nitride, SiBCN, SiNC, SiN, SiCO, SiNOC, or a combination thereof.

The bottom dielectric isolation 241 may be formed within the cavity or opening associated with the removed bottom sacrificial nanolayer 204 in between upper substrate 202 and the bottom most sacrificial nanolayer 206. In one example, the bottom dielectric isolation 241 may be formed of the same material as the one or more spacers 240.

The middle dielectric isolation 242 may be formed within the cavity or opening associated with the removed middle sacrificial nanolayer 210 in between the first series of nanolayers and the second series of nanolayers. In one example, the middle dielectric isolation 242 may be formed of the same material as the one or more spacers 240.

In one example, the one or more spacers 240, the bottom dielectric isolation 241, and the middle dielectric isolation 242 may be simultaneously formed by a deposition of a blanket dielectric material, such as such as silicon nitride, SiBCN, SiNC, SiN, SiCO, SiNOC, or a combination thereof. Excess, undesired, and/or exposed blanket dielectric material may be subsequently removed by a substrative removal technique, such as an etch. For example, a directional etch may remove exposed horizontal portion(s) of the blanket dielectric material but may retain vertical portion(s) of the blanket dielectric material that are upon the sidewalls of the one or more sacrificial gate structures 234 and protected portions of the blanket dielectric material within the cavities or openings associated with the removed bottom sacrificial nanolayer 204 and associated with the removed middle sacrificial nanolayer 210.

Further, in the depicted fabrication stage, source/drain (S/D) recesses 249 are formed within the one or more nanolayer stacks 220 between spacers 240 that are associated with neighboring sacrificial gate structures 234, thereby dicing or separating one or more of the nanolayer stacks 220, respectively.

The one or more S/D recesses 249 may be formed between adjacent sacrificial gate structures 234 by removing the portions of the sacrificial nanolayers 206, by removing the portions of the active nanolayers 208, by removing the portions of the bottom dielectric isolation 241, and by removing the portions of the middle dielectric isolation 242 that are between spacer(s) 240 of adjacent or neighboring sacrificial gate structures 234. The one or more S/D recesses 249 may be formed to a depth to stop at the upper substrate 202. In this manner, as depicted in the X cross-section, a respective nanolayer stack 220 is diced or separated and respective portions of the sacrificial nanolayers 206, the active nanolayers 208, the bottom dielectric isolation 241, the middle dielectric isolation 242 that are located below the spacer(s) 240 and below the sacrificial gate structures 234 are retained. These undesired portions of the nanolayers, bottom dielectric isolation 241, and the middle dielectric isolation 242 may be removed by etching or other subtractive removal techniques. The top surface of the upper substrate 202 may be used as an etch stop or other etch parameters may be controlled to stop the material removal at the upper substrate 202. The retained one or more portions of one or more nanolayer stacks 220 may be such portions thereof that were protected generally below and/or internal to respective sacrificial gate structures 234 and/or by the associated spacer(s) 240.

Further in the depicted fabrication stage, sacrificial nanolayers 206 within the one or more diced nanolayer stacks 220 that are underneath the respective spacer 240 may be indented, thereby forming an indent void, and a respective inner spacer 244 may be formed within an indent void.

The indent voids underneath respective spacer(s) 240 may be formed by a directional reactive ion etch (RIE) process, which can remove or indent portions of the sacrificial nanolayers 206 that are not covered by the sacrificial gate 236 and/or that are under the spacer(s) 240. The RIE can use a boron-based chemistry or a chlorine-based chemistry, for example, which selectively recesses the exposed portions sacrificial nanolayers 206 (e.g., those portions of sacrificial nanolayers 206 generally below spacer(s) 140, etc.) without significantly removing the active nanolayers 208, the bottom dielectric isolation 241, and/or the middle dielectric isolation 242 within the one or more diced nanolayer stacks 220.

Subsequently, a respective inner spacer 244 may be deposited in the recess or indent void that was previously formed into the respective sacrificial nanolayer 206. In certain embodiments, the material of the inner spacer 244 is a dielectric material such as SiN, SiO, SiBCN, SiOCN, SiCO, etc. In certain embodiments, after the formation of the inner spacers 244, an isotropic etch process is performed to create outer vertical edges or sidewalls of the inner spacers 244 that are coplanar or align with outer vertical edges or sidewalls of the active nanolayers 208 and/or the outer vertical edges or sidewalls of the spacers 240.

Figure 6:
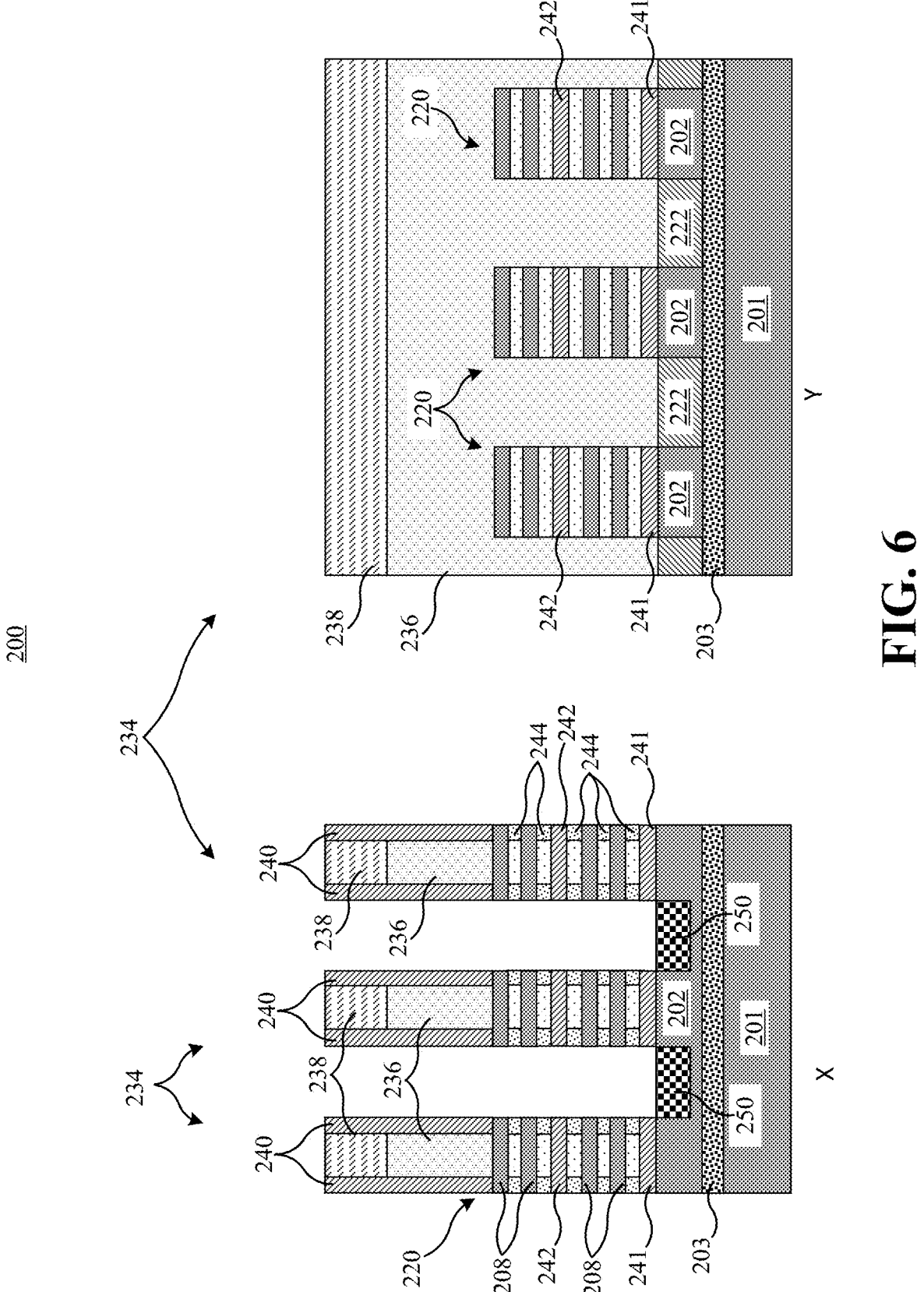

FIG. 6 depicts cross-sectional views of semiconductor IC device 200 shown after exemplary fabrication operation(s), in accordance with one or more embodiments. In the depicted fabrication stage, one or more backside contact placeholders 250 are formed within upper substrate 202 in between adjacent sacrificial gate structures 234. In one example, the one or more backside contact placeholders 250 may be formed only in locations in which a backside contact, such as backside contact 312 depicted in FIG. 19, backside contacts 422, 423, depicted in FIG. 21A, or the like, is to be formed. In an alternative example, the one or more backside contact placeholders 250 may be formed in location(s) in which a backside contact is to be formed and in location(s) where a backside contact is not to be formed in association therewith.

The one or more backside contact placeholders 250 may be formed by initially forming one or more backside contact placeholder cavities within the upper substrate 202 generally in between adjacent sacrificial gate structures 234 and underneath respective S/D locations. For example, the one or more backside contact placeholder(s) cavities may be formed by a subtractive removal technique, such as an etch, that removes associated portion(s) of the upper substrate 202. The etch may be timed or otherwise controlled to stop the removal of the upper substrate 202 such that the depth or bottom of the one or more backside contact placeholder(s) cavities is above the etch stop layer 203, as depicted.

The one or more backside contact placeholders 250 may be further formed by epitaxially growing an epitaxial material from exposed upper substrate 202 surface(s) within the one or more backside contact placeholder(s) cavities. In some embodiments, epitaxial growth and/or deposition processes may be selective to forming on the semiconductor surfaces of the upper substrate 202, and may not deposit material on dielectric surfaces, such as silicon dioxide or silicon nitride surfaces. In some embodiments, the epitaxial growth of the one or more backside contact placeholders 250 may overgrow above the top surface of upper substrate 202. In an example, the epitaxial material of the one or more backside contact placeholders 250 may be chosen to be etch selective to the material of the S/D region(s) 252, exemplarily depicted in FIG. 7, the material of the upper substrate 202, or the like. In an example, the one or more backside contact placeholders 250 may be bounded from front to rear by adjacent STI regions 222 and on each side by the upper substrate 202, as depicted.

Figure 7:
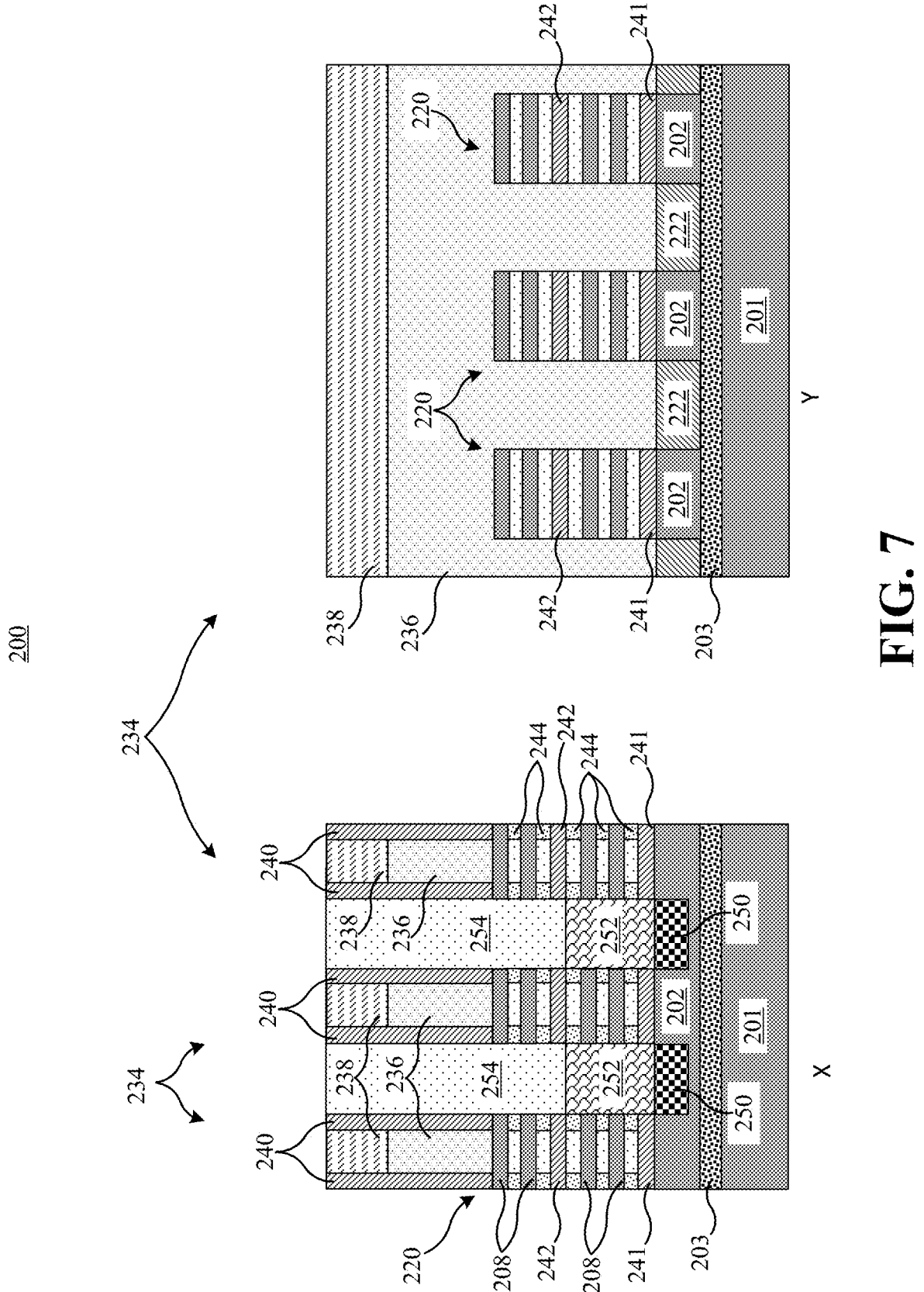

FIG. 7 depicts cross-sectional views of semiconductor IC device 100 shown after exemplary fabrication operation(s), in accordance with one or more embodiments. In the depicted fabrication stage, a S/D region 252 is formed upon a respective backside contact placeholder 250 and a sacrificial dielectric 254 is formed upon the S/D regions 252.

The S/D regions 252 are formed of a material that can form either a source or a drain, respectively, to a CMOS FET (e.g., the depicted lower FET in which the source or drain is connected to the active nanolayers 208 channels that are located between the bottom dielectric isolation 241 and the middle dielectric isolation 242) and a TFET (e.g., the to be formed FET in which the source or drain is connected to the active nanolayer 208 channel regions that are located above the middle dielectric isolation 242). S/D regions 252 may be epitaxially grown or formed. The S/D regions 252 may be formed by epitaxially growing epitaxial material upon a respective backside contact placeholder 250 within a source/drain region between neighboring sacrificial gate structures 234.

In some embodiments, the epitaxial growth of S/D regions 252 may overgrow above the upper surface of the middle dielectric isolation 242. Subsequently, the S/D regions 252 may be etched back. The etch may be timed or otherwise controlled to stop the removal of S/D regions 252 such that the top surface(s) thereof are below the top surface of the middle dielectric isolation 242 to electrically isolate or separate the exemplary depicted bottom CMOS FET and the top TFET.

In some examples, S/D regions 252 are formed by in-situ doped epitaxial growth. Suitable n-type dopants include but are not limited to phosphorous (P), and suitable p-type dopants include but are not limited to boron (B). The use of an in-situ doping process is merely an example. For instance, one may instead employ an ex-situ process to introduce dopants into S/D regions 252. Other doping techniques can be used to incorporate dopants in the S/D regions 252. Dopant techniques include but are not limited to, ion implantation, gas phase doping, plasma doping, plasma immersion ion implantation, cluster doping, infusion doping, liquid phase doping, continuous phase doping, in-situ epitaxy growth, or any suitable combination of those techniques. In preferred embodiments, the S/D epitaxial growth conditions that promote in-situ Boron doped SiGe for p-type transistor and phosphorus or arsenic doped silicon or Si:C for n-type transistors. The doping concentration in the S/D regions 252 can be in the range of $1\times1019$ cm–3 to $2\times1021$ cm–3, or preferably between $2\times1020$ cm–3 to $7\times1020$ cm–3. In a particular example, as depicted, the S/D regions 252 may be doped to form n-type S/D regions 252.

Further, in the depicted fabrication stage sacrificial dielectric 254 is formed upon and around the S/D regions 252, upon sidewalls of the middle dielectric isolation 242, upon inner spacers 244, upon spacers 240, or the like. The sacrificial dielectric 254 can be any suitable material, such as, for example, porous silicates, carbon doped oxides, silicon dioxides, silicon nitrides, silicon oxynitrides, or other dielectric materials. The sacrificial dielectric 254 can be formed using, for example, CVD, PECVD, ALD, flowable CVD, spin-on dielectrics, or PVD. In an example, the sacrificial dielectric 254 may be formed to a thickness above the top surface of the semiconductor IC device 200 and subsequently etched back such that the top surface of the sacrificial dielectric 254 is coplanar with a top surface of the sacrificial gate cap 268 and/or a top surface of spacer(s) 240. In another example, after deposition of the sacrificial dielectric 254 a planarization process, such as a chemical mechanical polish (CMP), may be performed to create a planar upper surface for the semiconductor IC device 200. For example, respective top surfaces of the sacrificial dielectric 254, spacers 240, and sacrificial gate 236 or sacrificial gate cap 268 may be horizontally coplanar.

Figure 8:
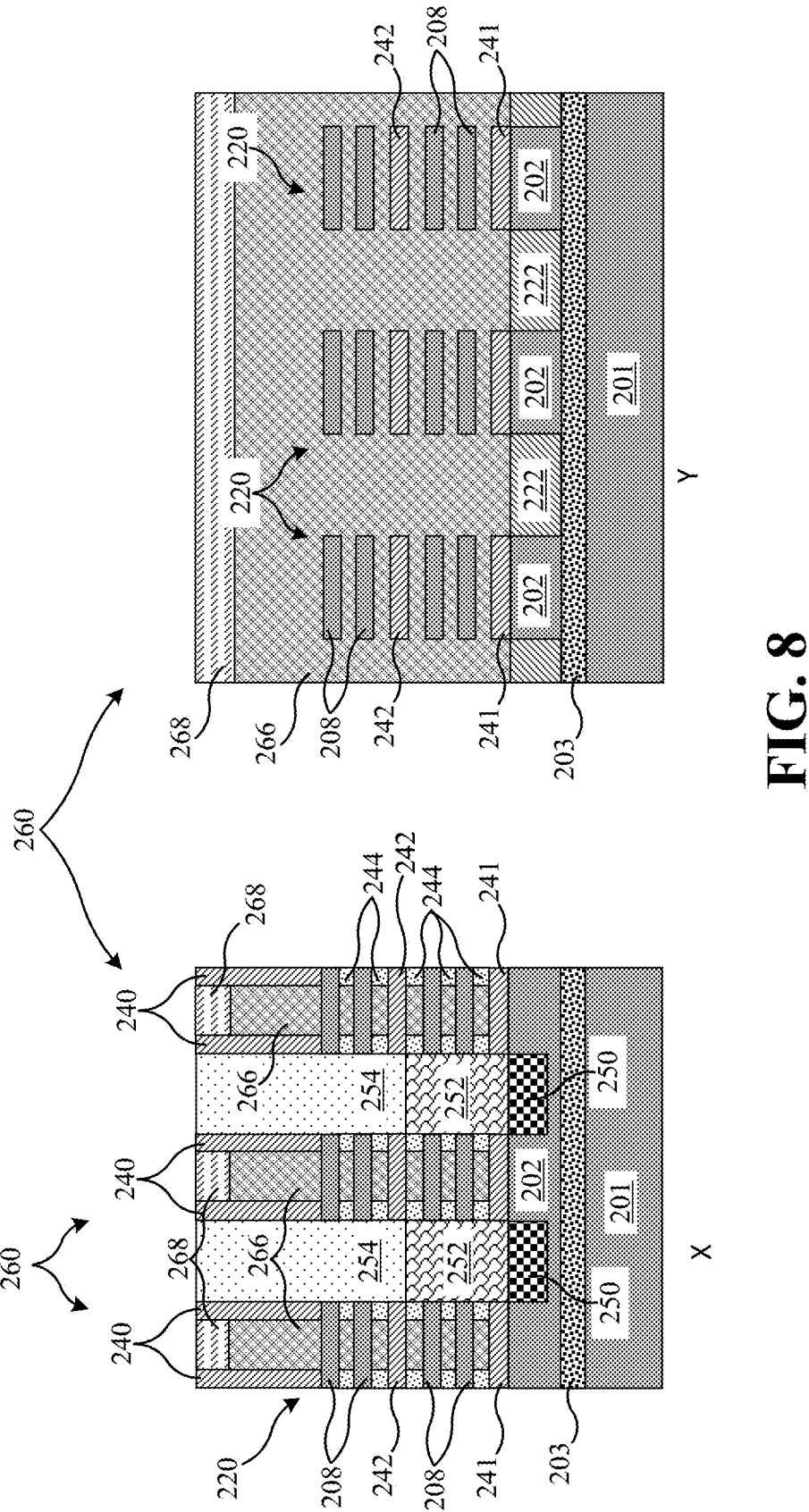

FIG. 8 depicts cross-sectional views of semiconductor IC device 200 shown after exemplary fabrication operation(s), in accordance with one or more embodiments. In the depicted fabrication stage, the sacrificial gate structures 234 and the sacrificial nanolayers 206 are removed. Further in the depicted fabrication stage, replacement gate structures 260 are formed.

The one or more sacrificial gate structures 234 may be removed by removing respective sacrificial gates 236, sacrificial gate oxide (if present), and the sacrificial nanolayers 206 associated therewith by a subtractive removal technique, such as one or more etches. For example, removal of these features may be accomplished by an etching process which may include a dry etching process such as RIE, plasma etching, ion etching or laser ablation. The etching can further include a wet chemical etching process(es).

After the removal of sacrificial nanolayers 206, void spaces exist between the neighboring semiconductor nanolayers 208, bottom dielectric isolation 241, and/or middle dielectric isolation 242, respectively, as appropriate. It should be appreciated that during the removal of the sacrificial gate 236, the sacrificial oxide layer, the sacrificial nanolayers 206, and/or the like, etchant(s) may be used that do not significantly remove material of active semiconductor nanolayers 208, upper substrate 202, inner spacers 244, spacers 240, bottom dielectric isolation 241, middle dielectric isolation 242, or the like.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

The replacement gate structures 260 may be formed by initially forming an interfacial layer (not shown) on the STI regions 222, upon the interior surfaces of the spacers 240, on the interior surfaces of the active nanolayers 208, on the interior surfaces of the middle dielectric isolation 242, upon the of the bottom dielectric isolation 241, on the inner spacers 240, or the like. A high-κ layer (not shown) may be formed to cover the surfaces of exposed surfaces of the interfacial layer. The high-κ layer can be deposited by any suitable techniques, such as ALD, CVD, metal-organic CVD (MOCVD), physical vapor deposition (PVD), thermal oxidation, combinations thereof, or other suitable techniques. A high-κ material is a material with a higher dielectric constant than that of $SiO_2$, and can include e.g., LaO, AlO, ZrO, TiO, Ta2O5, Y2O3, SrTiO3(STO), BaTiO3 (BTO), BaZrO, HfZrO, HfLaO, HfSiO, LaSiO, AlSiO, HfTaO, HfTiO, BaSrTiO3 (BST), Al2O3, Si3N4, oxynitrides (SiON), or other suitable materials. The high-κ layer can include a single layer or multiple layers, such as metal layer, liner layer, wetting layer, and adhesion layer. In other embodiments, the high-κ layer can include, e.g., Ti, Ag, Al, TiAlN, TaC, TaCN, TaSiN, Mn, Zr, TiN, TaN, Ru, Mo, Al, WN, Cu, W, or any suitable materials.

The one or more replacement gate structures 260 may be further formed by depositing a work function (WF) gate (not shown) upon the high-κ layer. The WF gate can be comprised of metals, such as, e.g., copper (Cu), cobalt (Co), aluminum (Al), platinum (Pt), gold (Au), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In general, the work function (WF) gate sets the threshold voltage (Vt) of the transistors within the active regions. The high-κ layer may be between and separate the WF gate from the active nanolayers 208. The WF gate may be formed to a thickness to generally fill the gaps or voids between active nanolayers 208.

The one or more replacement gate structures 260 may be further formed by depositing a conductive fill gate 266 upon the WF gate. The conductive fill gate 266 can be comprised of metals, such as but not limited to, e.g., tungsten, aluminum, ruthenium, rhodium, cobalt, copper, tantalum, titanium, carbon nanowire materials including graphene, or the like. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. After the replacement gate structure 260 formation, the top surface of the semiconductor IC device 200 may be planarized by a planarization technique such as a CMP, mechanical grinding process, or the like.

In some examples, the one or more replacement gate structures 260 may further include a gate cap 268, as depicted. The gate cap 268 may be formed by depositing a mask material, such as a hard mask material, such as silicon nitride, silicon oxide, combinations thereof, or the like, upon the conductive fill gate 266. The gate cap 268 may be composed of one or more layers of masking materials.

After formation of the one or more replacement gate structures 260, a planarization process, such as a chemical mechanical polish (CMP), may be performed to create a planar upper surface for the semiconductor IC device 200.

For example, respective top surfaces of the sacrificial dielectric 254, spacers 240, and gate cap 268 may be horizontally coplanar.

Figure 9:
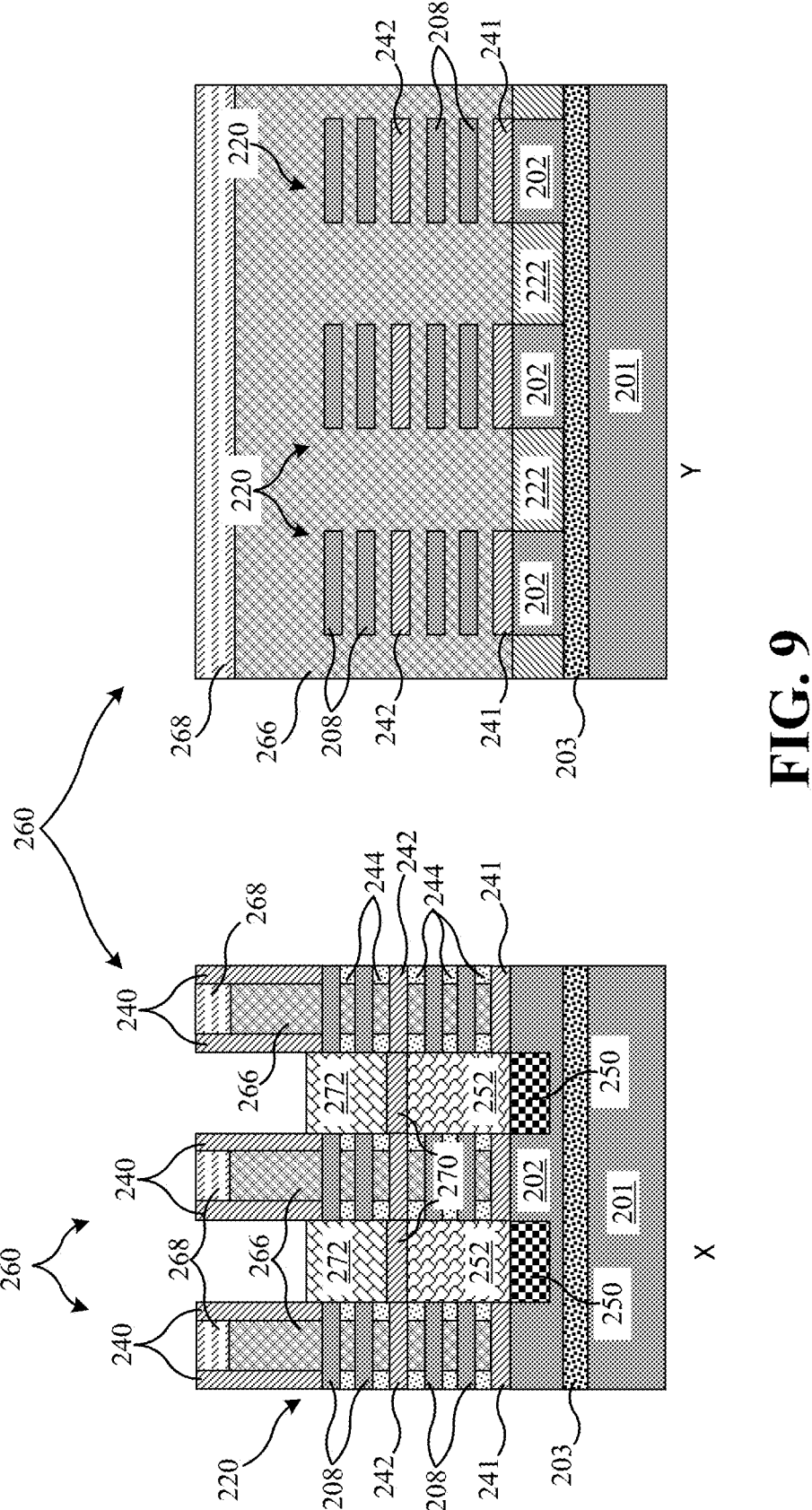

FIG. 9 depicts cross-sectional views of semiconductor IC device 200 shown after exemplary fabrication operation(s), in accordance with one or more embodiments. In the depicted fabrication stage, the sacrificial dielectric 254 is removed, one or more S/D isolation regions 270 are formed, and one or more S/D regions 272 are formed.

The sacrificial dielectric 254 may be removed by a subtractive removal technique such as a dry and/or wet etch. Upon removal of sacrificial dielectric 254, respective top surfaces of the S/D region 252 are exposed and respective facing sidewall surfaces of middle dielectric isolation 242 instances, inner spacers 244, active nanolayers 208, and spacers 240 are exposed. The removal of the sacrificial dielectric 254 may be selective to the materials of S/D region 252, middle dielectric isolation 242 instances, inner spacers 244, active nanolayers 208, and/or spacers 240, etc.

The one or more S/D isolation regions 270 may be formed by depositing a dielectric material, such as a hard mask material, such as silicon nitride, silicon oxide, combinations thereof, or the like, upon respective S/D region 252, upon the inner facing sidewalls of neighboring middle dielectric isolation 242 instances, etc. Generally, the one or more S/D isolation regions 270 are horizontally in line with middle dielectric isolation 242 instances. For example, a horizontal plane may interest with each of the one or more S/D isolation regions 270 and with each of the middle dielectric isolation 242 instances, as depicted. This horizontal plane may effectively vertically separate the MOSFET from the TFET. The one or more S/D isolation regions 270 may be composed of one or more layers of dielectric materials to vertically separate the MOSFET from the TFET.

The end surface(s) of the bottom active nanolayer 208 that is located above the middle dielectric isolation 242 may be kept exposed by limiting the top surface of the one or more S/D isolation regions 270 to be below the bottom surface(s) of such bottom active nanolayer(s) 208, as depicted. The exposed end surface(s) of the bottom active nanolayer(s) 208 allows for epitaxial growth of a respective S/D region 272 therefrom.

The one or more S/D regions 272 are formed of a material that can form either a source or a drain, respectively, to a TFET (e.g., the depicted upper FET in which the source or drain is connected to the active nanolayers 208 channel regions that are located above the middle dielectric isolation 242). S/D regions 272 may be epitaxially grown or formed. The S/D regions 272 may be formed by epitaxially growing epitaxial material from upon respective sidewalls or end surfaces of the active nanolayers 208 that are above the one or more S/D isolation regions 270 within the source/drain region between neighboring replacement gate structures 260.

In some embodiments, the S/D regions 272 epitaxial growth may overgrow above the upper surface of the topmost active nanolayer 208. Subsequently, the S/D regions 272 may be etched back. The etch may be timed or otherwise controlled to stop the removal of S/D regions 272 such that the top surface(s) thereof are above the top surface of the topmost active nanolayer 208 but below the top surface of the replacement gate fill 266.

In some examples, S/D regions 272 are formed by in-situ doped epitaxial growth. Suitable n-type dopants include but are not limited to phosphorous (P), and suitable p-type dopants include but are not limited to boron (B). The use of an in-situ doping process is merely an example. For instance, one may instead employ an ex-situ process to introduce dopants into S/D regions 272. Other doping techniques can be used to incorporate dopants in the S/D regions 272. The doping concentration in the S/D regions 272 can be in the range of $1 \times 1019$ cm$-3$ to $2 \times 1021$ cm$-3$, or preferably between $2 \times 1020$ cm$-3$ to $7 \times 1020$ cm$-3$.

In a particular example, as depicted, the S/D regions 272 may be doped to form p-type S/D regions 272. That is, S/D regions 272 are the logical opposite material type relative to the S/D regions 252. For example, when the S/D regions 252 are doped to form n-type S/D regions 252 then S/D regions 272 are doped to form p-type S/D regions 272. Alternatively, when the S/D regions 252 are doped to form p-type S/D regions 252 then S/D regions 272 are doped to form n-type S/D regions 272.

Figure 10:
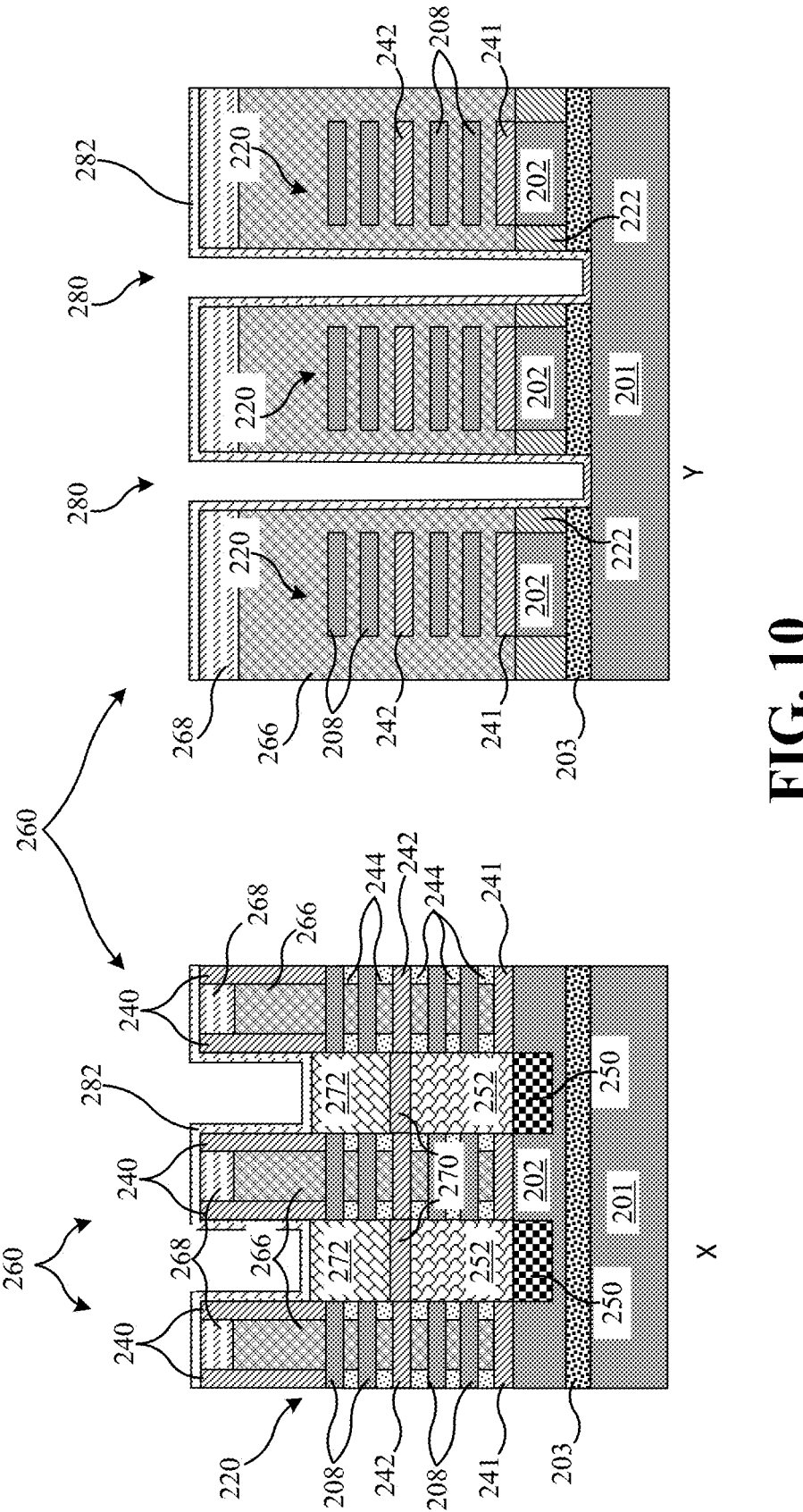

FIG. 10 depicts cross-sectional views of semiconductor IC device 200 shown after exemplary fabrication operation(s), in accordance with one or more embodiments. In the depicted fabrication stage, one or more gate cut trenches 280 may be formed and a liner 282 is formed.

The one or more gate cut trenches 280 may be formed by removing portion(s) of the replacement gate structures 260 (e.g., gate cap 268, replacement gate fill 266, or the like) that are between active regions and/or that are between nanolayer stacks 220. Such removal may be accomplished by a substrative removal technique such as a wet and/or dry etch. The etch may stop at the top surface of the one or more STI regions 222. Alternatively, the etch may stop at the top surface of the etch stop layer 203. In another example, as depicted, the etch may stop at the top surface of the lower substrate 201. The one or more gate cut trenches 280 effectively split or dice a respective replacement gate structure 260 into distinct replacement gate structures 260, with each distinct replacement gate structure 260 being associated with a particular nanolayer stack 220.

The removed portions of the one or more replacement gate structures 260 may be removed removal techniques such as e.g., depositing and patterning a gate cut mask, lithography or patterning of the mask to define the gate cut regions 237 (e.g., depicted in FIG. 3), using the patterned mask to transfer the gate cut regions 237 onto the one or more replacement gate structures 260, and etching these unprotected materials of the one or more replacement gate structures 260 with one or more appropriate etch stages.

The one or more gates cut trenches 280 may be formed to the depth, such that the lower or bottom well surface of the one or more gates cut trenches 280 are below the top surface of the upper substrate 202. In this implementation, associated portions of STI regions 222, etch stop layer 203, or the like, may be removed removal techniques such as further etching stages to remove these materials that were previously exposed by the initial one or more gates cut trenches 280 formation.

Further, in the depicted fabrication stage, liner 282 is formed upon the one or more spacers 240, the one or more gate caps 268, the one or more S/D regions 272, and upon the inner surfaces of the one or more gates cut trenches 280 (e.g., gate cut formed sidewalls of gate cap 268, replacement gate fill 266, STI regions 222, etch stop layer 203, and the upper surface of lower substrate 201). The liner 282 can be any suitable material, such as, for example, porous silicates, carbon doped oxides, silicon dioxides, silicon nitrides, silicon oxynitrides, or other dielectric materials. The liner 282 can be formed using, for example, CVD, PECVD, ALD, flowable CVD, spin-on dielectrics, or PVD.

Figure 11:
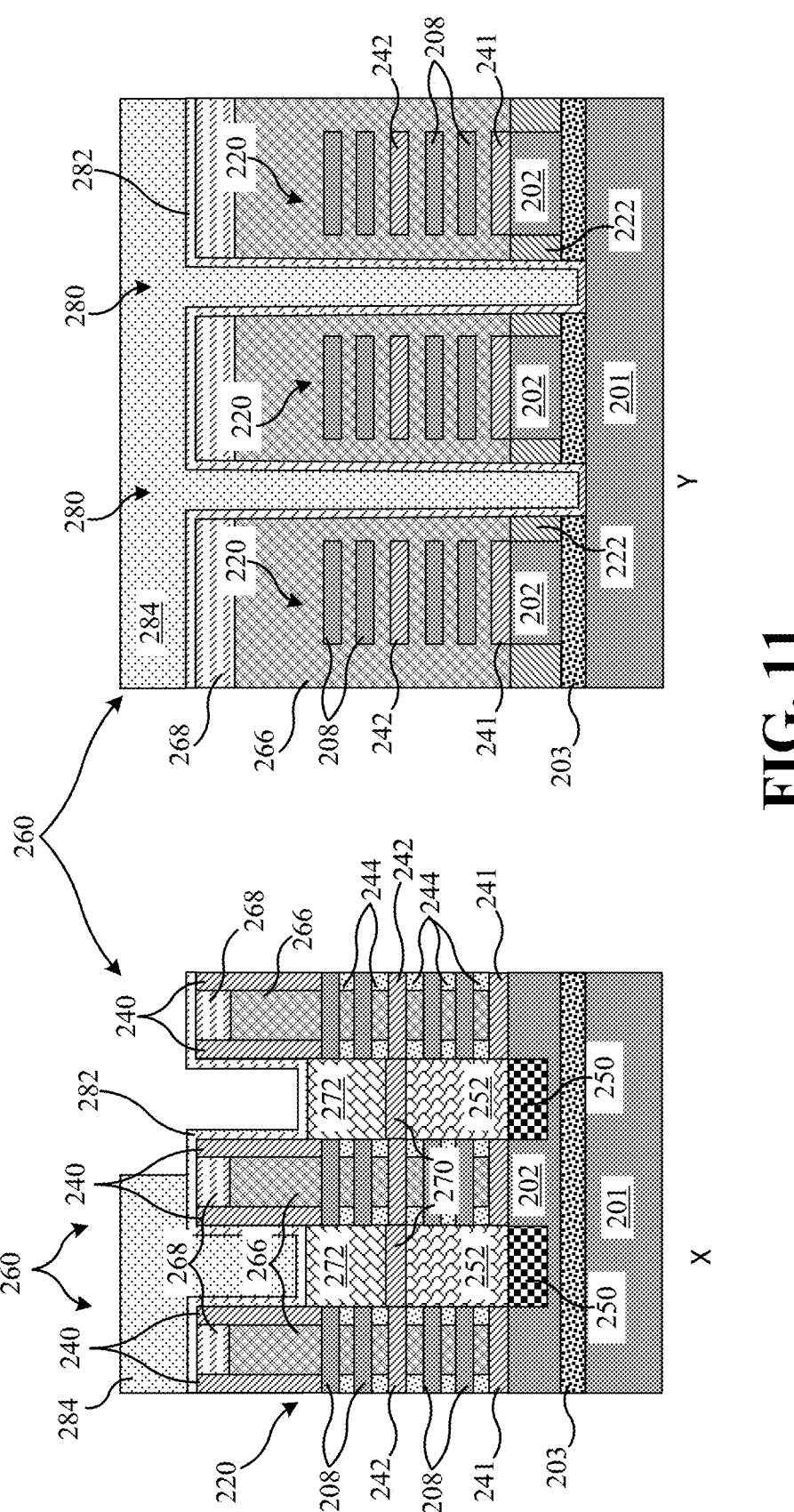

FIG. 11 depicts cross-sectional views of semiconductor IC device 200 shown after exemplary fabrication operation(s), in accordance with one or more embodiments. In the depicted fabrication stage, mask 284 is formed and patterned.

The mask 284 may be formed by depositing a blanket mask layer, consisting of a dielectric material or other mask material, upon the liner 282. Using lithography and etching techniques the blanket mask layer may be opened or patterned in predetermined location(s) above first one or more vertical stacks of S/D region 272 and S/D region 252. In other examples, the mask 284 may be formed directly, selectively, or, in other words, only over second one or more vertical stacks of S/D region 272 and S/D region 252 to protect such vertical stacks there below.

The mask 284 can be any suitable material, such as, for example, porous silicates, oxides, nitrides, silicon oxynitrides, organic planarization layer (OPL), or other dielectric materials. Any known manner of forming the mask 284 can be utilized. For example, the mask 284 can be formed using, for example, CVD, PECVD, ALD, flowable CVD, spin-on dielectrics, PVD, or the like.

Figure 12:
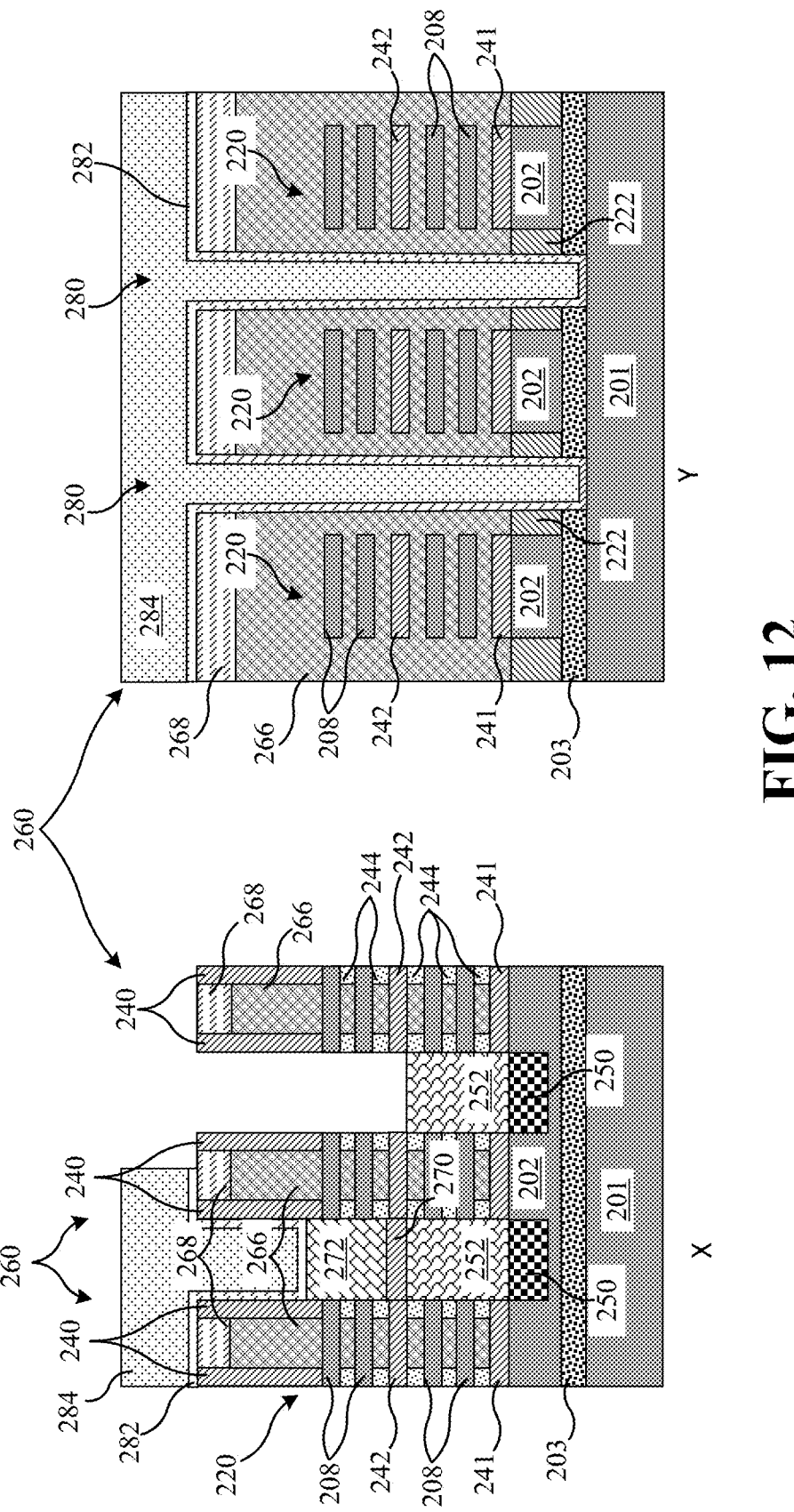

FIG. 12 depicts cross-sectional views of semiconductor IC device 200 shown after exemplary fabrication operation(s), in accordance with one or more embodiments. In the depicted fabrication stage, one or more first S/D regions 272 are removed and one or more first S/D isolation regions 270 thereunder are removed to exposed one or more first S/D regions 252 thereunder.

Using the mask 284 to protect the second one or more vertical stacks of S/D region 272 and S/D region 252 there below, the one or more first S/D regions 272 and the one or more first S/D isolation regions 270 may be removed by an appropriate substrative removal technique, such as an etch. The etch may be timed or otherwise controlled to remove the material of the S/D region(s) 272 and the material of the S/D isolation region(s) 270, while the respective materials of the S/D region(s) 252, active nanolayers 208, inner spacers 244, middle dielectric isolation 242 instances, and the like, are retained.

The etch may generally remove the first one or more first S/D regions 272 and the one or more first S/D isolation regions 270 to expose the one or more first S/D regions 252 there below. In other words, the entire top surface of the one or more first S/D regions 252 may be exposed by the removal of the respective one or more first S/D regions 272 and the one or more first S/D isolation regions 270 there above.

The liner 282 that is exposed by the opened or patterned mask 284 may be first removed selective to the materials of gate cap(s) 268, spacers 240, first S/D regions 272, and the like. Next, the first one or more first S/D regions 272 may be removed selective to the materials spacers 240, active nanolayers 208, inner spacers, S/D isolation region 270, and the like. Next, the exposed S/D isolation region 270 instances may be removed selective to the inner spacers 244, middle dielectric isolation 242 instances, and S/D region 252, and the like. For example, removal of these features may be accomplished by a series of etching processes which may include a dry etching process such as RIE, plasma etching, ion etching or laser ablation. The etching processes can further include a wet chemical etching. The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

Subsequently, the mask 284 may be removed by a subtractive removal technique, such as an etch, OPL ash, or the like.

Figure 13:
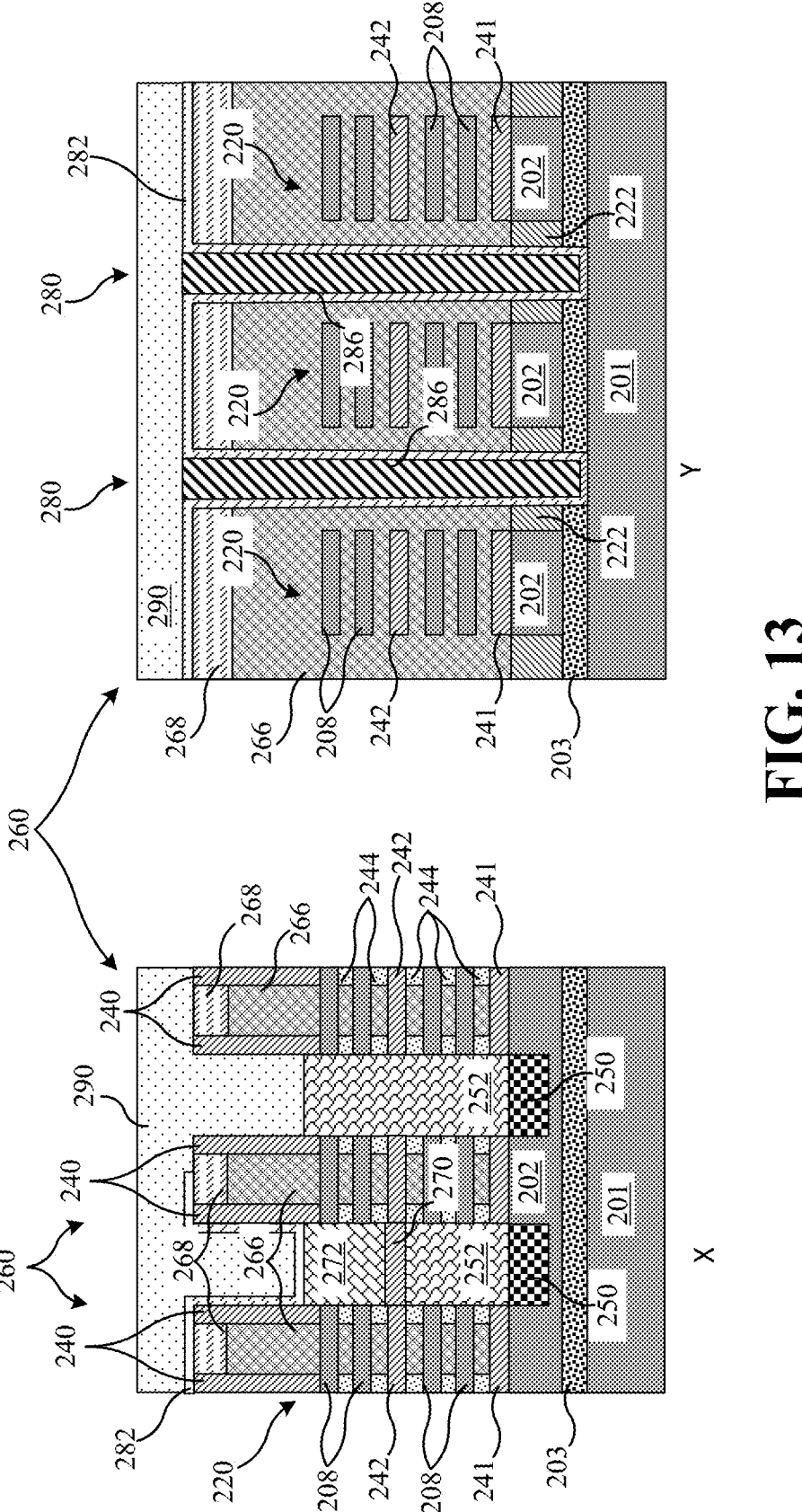

FIG. 13 depicts cross-sectional views of semiconductor IC device 200 shown after exemplary fabrication operation(s), in accordance with one or more embodiments. In the depicted fabrication stage, S/D region 252 is enlarged, a gate cut fill 286 is formed within a respective gate cut trench 280, and an ILD 290 is formed.

The enlarged portion of the S/D regions 252 is the same material as the underlying initial S/D regions 252 and is therefore formed of a material that can form either a source or a drain, respectively, to a CMOS FET (e.g., the depicted lower FET in which the source or drain is connected to the active nanolayers 208 channels that are located between the bottom dielectric isolation 241 and the middle dielectric isolation 242) and a TFET (e.g., the to be formed FET in which the source or drain is connected to the active nanolayer 208 channel regions that are located above the middle dielectric isolation 242). The enlarged S/D regions 252 may be formed by enlarging the initial S/D regions 252 by epitaxially growing epitaxial material upon a respective the initial S/D region(s) 252 within the source/drain region between neighboring replacement gate structures 260. Generally, the term "enlarging" or derivatives with reference to the tall S/D region(s) described herein shall mean that additional S/D material of the same type relative to the initial S/D region is added to the initial S/D region, deposited upon the initial S/D region, grown upon the initial S/D region, or the like, to add volume to the initial S/D region.

In some embodiments, the enlarged S/D regions 252 epitaxial growth may overgrow above the upper surface of the topmost active nanolayer 208. Subsequently, the enlarged S/D regions 252 may be formed, may be etched back so that the top surface of the enlarged S/D regions 252 are coplanar with the top surface of S/D regions 272. In this way, subsequently fabrication stages may be more reliable (e.g., frontside contacts may be more geometrically similar when the top surface of the enlarged S/D regions 252 are coplanar with the top surface of S/D regions 272), which may increase yields. The etch may be timed or otherwise controlled to stop the removal of enlarged S/D regions 252 such that the top surface(s) thereof are coplanar with the top surface of S/D regions 272.

In the depicted example, the enlarged S/D regions 252 may be doped to form n-type S/D regions 252.

One or more gate cut fill 286 instances may be formed by depositing a dielectric material within the inner facing side surfaces and bottom well surface of gate cut trench(es) 280 with a deposition method, such as ALD, CVD, or the like. The dielectric material can comprise any suitable dielectric material, including but not limited to silicon oxide, silicon nitride, silicon oxynitride, low-k materials (i.e., a material with a lower dielectric constant relative to silicon dioxide), or any combination of these materials. In some embodiments, dielectric layer 142 has a thickness ranging from 1 nm to 5 nm, although less thickness and greater thickness are also conceived.

Further, in the depicted fabrication stage ILD 290 is formed upon and around the enlarged S/D regions 252, upon liner 282, upon one or more replacement gate structures 260, or the like. The ILD 290 can be any suitable dielectric material, such as, for example, porous silicates, carbon doped oxides, silicon dioxides, silicon nitrides, silicon oxynitrides, or other dielectric materials.

In one example, the one or more gate cut fill 286 instances and the ILD 290 are the same material and may be formed with during the same blanket dielectric material deposition stage. For example, the one or more gate cut fill 286 instances and the ILD 290 can be formed using, for example, CVD, PECVD, ALD, flowable CVD, spin-on dielectrics, or PVD. In an example, the one or more gate cut fill 286 instances and the ILD 290 may be formed to a thickness above the top surface of the semiconductor IC device 200. After deposition of the one or more gate cut fill 286 instances and the ILD 290, a planarization process, such as a chemical mechanical polish (CMP), may be performed to create a planar upper surface for the semiconductor IC device 200.

Figure 14:
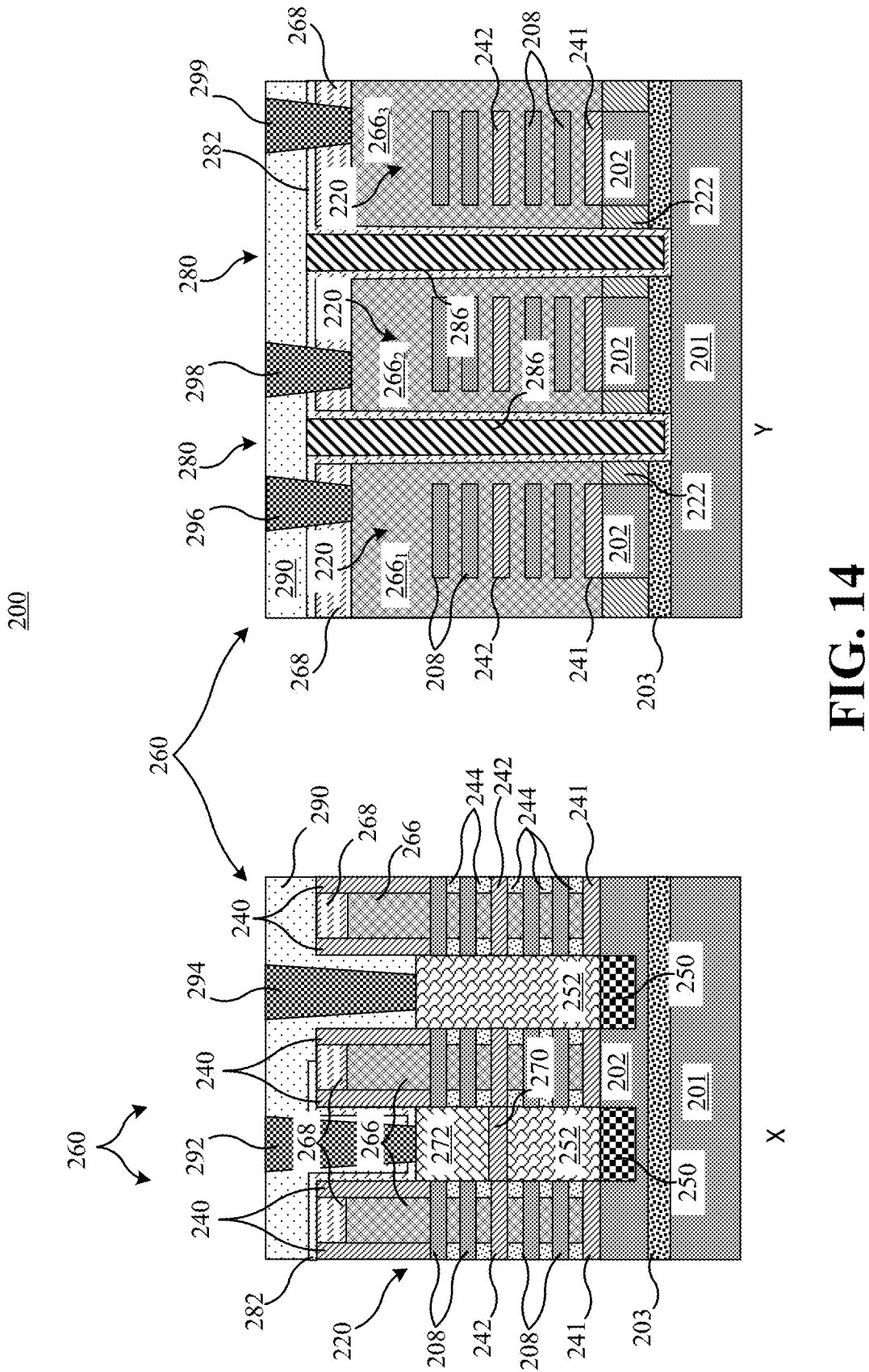
Figure 15:
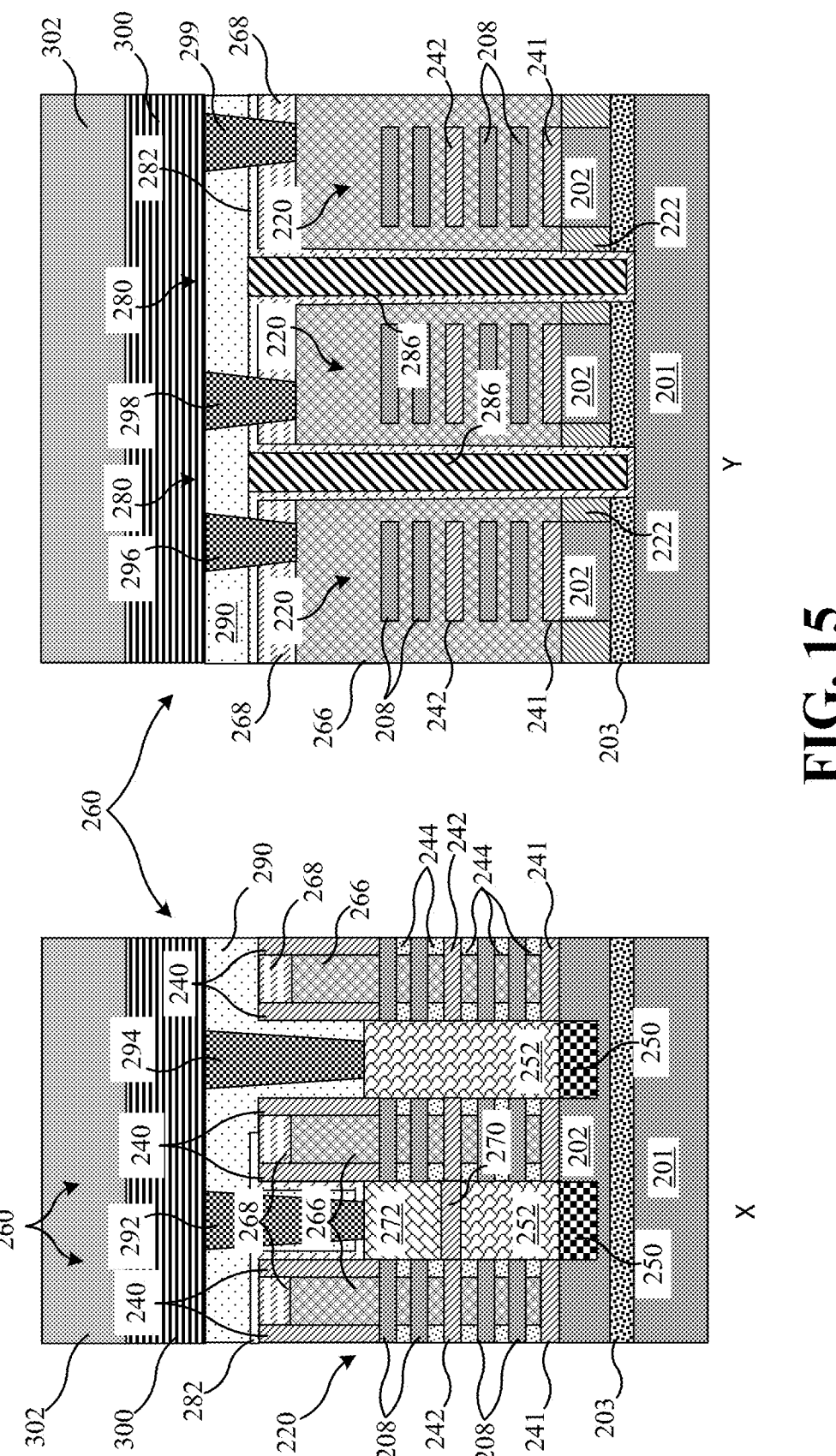

FIG. 14 depicts cross-sectional views of semiconductor IC device 200 shown after exemplary fabrication operation(s), in accordance with one or more embodiments. In the depicted fabrication stage, frontside contact(s) 292, 294, 296, 298, 299, or the like are formed.

For clarity, one or more frontside contacts may be selectively formed in predetermined or desired locations where a frontside contact is desirable to contact an underlying structure, such as a S/D region, replacement gate structure, or the like. For instance, in one example, frontside contact 292 may be formed to meld or connect with the underlying S/D region 272 and frontside contact 294 may be formed to meld or connect with the underlying enlarged S/D region 252. In another example, a frontside contact 292 may be formed to meld or connect with the underlying S/D region 272 while the other of the S/D region 252 that is below the S/D region 272 and the enlarged S/D region 252 will contacted by a respective backside contact, which may be formed in subsequent fabrication stages.

The frontside contacts may be formed by initially forming frontside contact openings (not shown) within ILD 290, within liner 282, within gate cap 268, as appropriate depending upon the location or type of the frontside contact to be formed. The formation of the frontside contact openings may include one or more etches to remove the applicable material(s) to expose a portion of the S/D region 272, a portion of the S/D region 252, and respective portions of replacement gate fill 266₁, 266₂, and 266₃.

Frontside contacts 292, 294, 296, 298, and 299 may be formed by depositing conductive material within the frontside contact openings. The formation of the frontside contacts 292, 294, 296, 298, and 299 may include forming a blanket conductive barrier layer extending into the frontside contact openings, depositing a metal or conductive material over the blanket conductive barrier layer, and performing a planarization process, such as a CMP process or a mechanical grinding process, to remove excess portions of the conductive barrier layer and the conductive material. Frontside contacts 292, 294, 296, 298, and 299 may consist of a liner formed of Ni, NiPt, Ti, TiN, TaN, etc. and a conductive fill thereupon, such as Al, Ru, W, Co, Cu, etc. In some implementations, the formation of frontside contacts 200, 202 may be a part of middle of the line (MOL) fabrication processes.

Frontside contact 292 contacts or otherwise melds to the exposed and associated portion of the S/D region 272 there below. Likewise, frontside contact 294 contacts or otherwise melds to the exposed and associated portion of the enlarged S/D region 252 there below. Likewise, frontside contact 296 contacts or otherwise melds to the exposed and associated portion of the replacement gate fill 266₁ there below. Similarly, frontside contact 298 contacts or otherwise melds to the exposed and associated portion of the replacement gate fill 266₂ there below. Further, frontside contact 299 contacts or otherwise melds to the exposed and associated portion of the replacement gate fill 266₃ there below.

The frontside contacts 292 may be connected to a power rail within the BEOL network 300 (exemplarily depicted in FIG. 15) and may provide power potential (VDD, VSS, or the like) to the S/D region 164 there below. A power rail is defined herein as a conductive feature, such as a wire, trace, plane, or the like, that is configured to electrically carry a logical electrical potential that does not change over a steady state period.

The frontside contacts 296, 298, and 299 may be further connected to a signal line within the frontside BEOL network 300 and electrically carry a functional or logical potential or signal that is to change or is otherwise dynamic within the steady state period. Such functional or logical potential or signal may determine whether the transistor associated with the replacement gate fill 266₁, 266₂, and 266₃ instances are on or off, respectively.

FIG. 14 depicts cross-sectional views of semiconductor IC device 200 shown after exemplary fabrication operation(s), in accordance with one or more embodiments. In the depicted fabrication stage, frontside BEOL network 300 is formed and a carrier wafer 302 is bonded thereto.

Frontside BEOL network 300 includes conductive wires, rails, planes, traces, or the like within different metallization levels, associated metallization dielectric or passivation layers, vertical vias that connect predetermined conductive features within the metallization levels with an underlying device or structure, and/or conductive I/O pads, or the like.

In some examples, there may be five metal levels M0-M4 within frontside BEOL network 300. In some examples, there may be more than ten metal levels M0-Mx within BEOL network 300. In some examples, frontside contact 292 may contact and connect the respective S/D region 272 there below to a via, signal line, power rail, or the like, located within the lowest BEOL metal level M0 within BEOL network 300. Likewise, frontside contact 294 may contact and connect the respective enlarged S/D region 252 there below to a via, signal line, power rail, or the like, located within the lowest BEOL metal level M0 within BEOL network 300.

Generally, the frontside BEOL network 300 is located on the frontside of the semiconductor IC device 200. Upon completion of the frontside BEOL network 300, carrier wafer 302 may be bonded or otherwise attached to the top surface of BEOL network 300, as depicted. Carrier wafer 302 may be attached to semiconductor IC device 100 by any carrier bonding technique.

Figure 16:
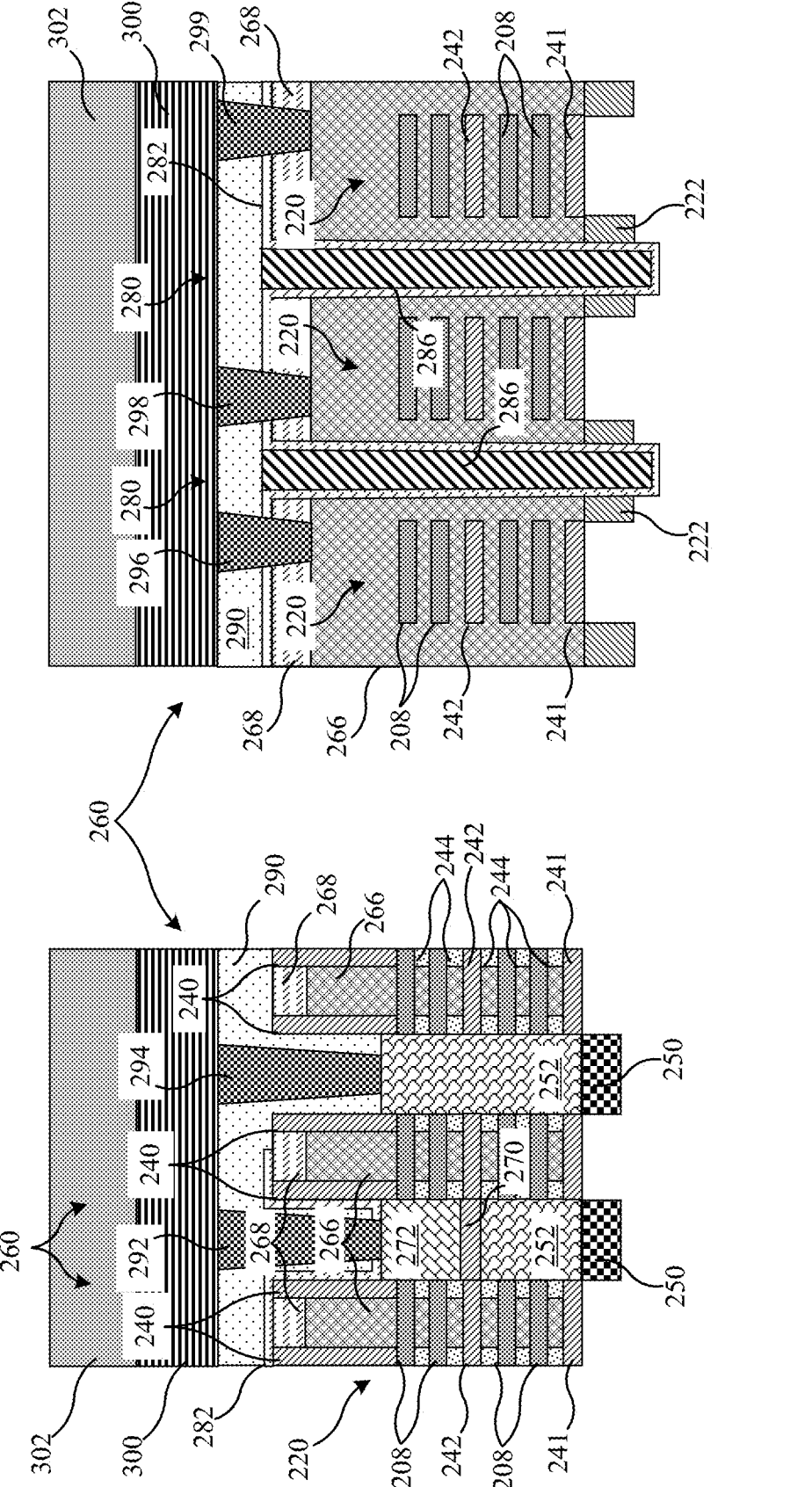

FIG. 16 depicts cross-sectional views of semiconductor IC device 100 shown after exemplary fabrication operation(s), in accordance with one or more embodiments. In the depicted fabrication stage, semiconductor IC device 100 is flipped (not shown) and lower substrate 201, etch stop layer 203, and upper substrate 202 are removed. The lower substrate 201 may be removed by any removal technique, such as a combination of wafer grinding, CMP, dry, and/or wet etch.

The substrate 201, etch stop layer 203, and upper substrate 202 may be removed in sequential etching stages. For example, lower substrate 201 is removed by an etch that utilizes etch stop layer 203 as the etch stop, then etch stop layer 203 is removed by an etch that utilizes upper substrate 202 as the etch stop, then upper substrate 202 is removed by an etch that utilizes bottom dielectric isolation 241 as the etch stop. The etches may be timed or otherwise controlled to remove the material of upper substrate 202 and retain or otherwise expose the backside contact placeholders 250, retain and partially expose the bottom dielectric isolation 241 instances, retain and expose STI region(s) 222, and retain and expose the liner 282 associated with the gate cut fill 286 instances.

Figure 17:
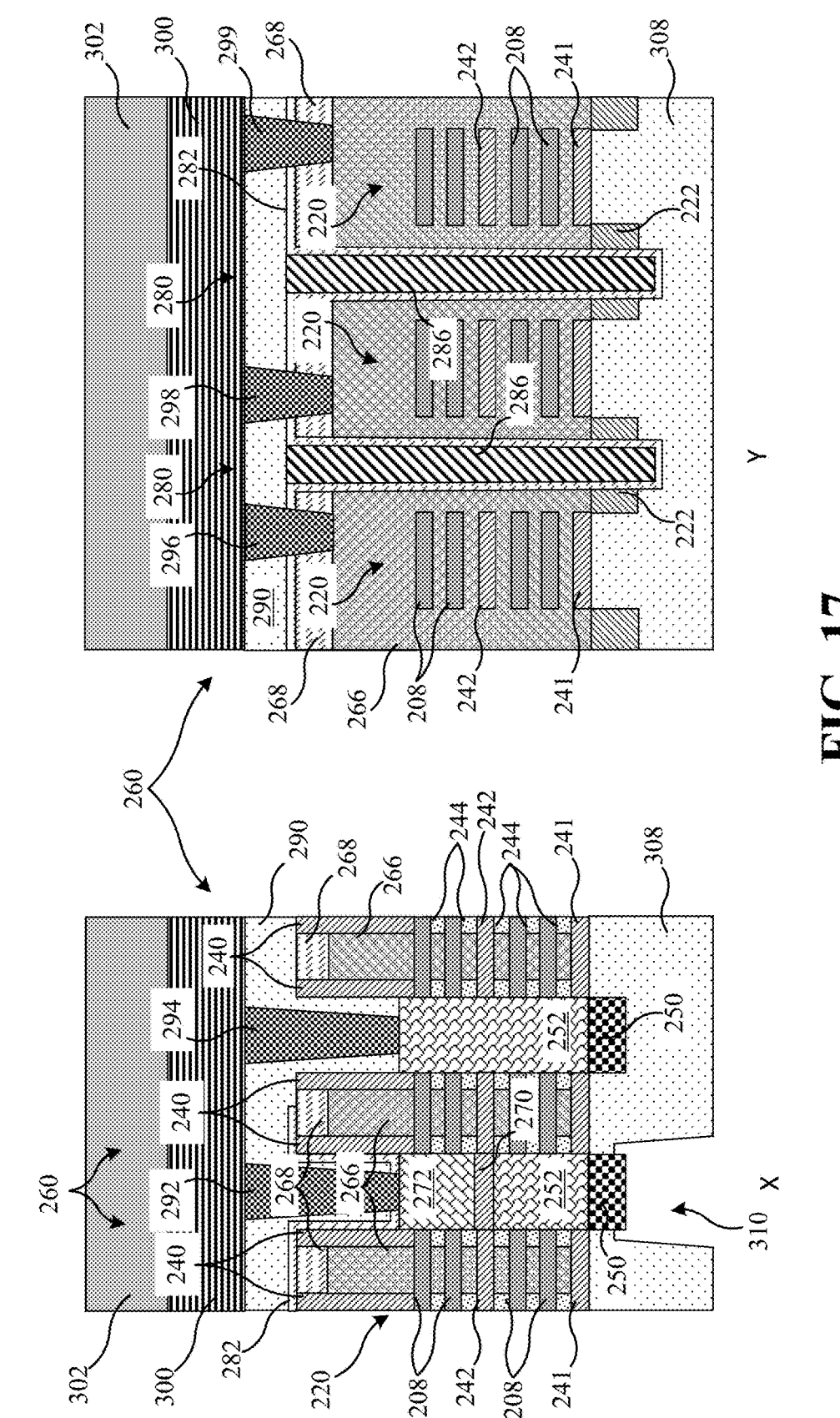

FIG. 17 depicts cross-sectional views of semiconductor IC device 100 shown after exemplary fabrication operation(s), in accordance with one or more embodiments. In the depicted fabrication stage, ILD 308 is formed upon the exposed backside of the semiconductor IC device 200 and one or more backside contact openings 310 are formed within ILD 308.

For clarity, one or more backside contact openings may be selectively formed in predetermined or desired locations where a backside contact is desirable to contact an associated structure, such as a S/D region. For instance, in one example, a backside contact may be formed to meld or connect with the associated S/D region 252 that is below the S/D region 272. In another example, as is implemented by semiconductor IC device 400 shown in FIG. 21A and by semiconductor IC device 600 shown in FIG. 23A, a backside contact may be formed to meld or connect with a bottom short S/D region and another backside contact may be formed to meld or connect with the tall S/D region.

The ILD 308 may be formed upon and around the exposed backside contact placeholders 250, formed upon STI region(s) 222, formed upon and around the liner 282 associated with the gate cut fill 286 instances, and formed upon the exposed surfaces bottom dielectric isolation 241 instances. The ILD 308 may be formed by depositing a dielectric material, such as, for example, porous silicates, carbon doped oxides, silicon dioxides, silicon nitrides, silicon oxynitrides, or other dielectric materials. Any appropriate deposition technique for forming the ILD 308 can be utilized. The ILD 308 can be formed using, for example, CVD, PECVD, ALD, flowable CVD, spin-on dielectrics, or PVD.

Further in the depicted fabrication stage, one or more backside contact openings 310 may be formed within the ILD 308 generally below a respective backside contact placeholders 250. A respective backside contact opening 310 may be formed from the backside of the semiconductor IC device 200 through ILD 308 and may expose a portion of the bottom surface and/or side surface(s) of the associated backside contact placeholder 250.

The backside contact opening(s) 310 may be formed by a subtractive removal technique, such as an etch, that removes associated portion(s) of the ILD 308. The etch may be timed or otherwise controlled to stop the removal of the ILD 308 such that the depth or well of backside contact opening(s) 310 exposes the bottom and/or side surfaces of the associated backside contact placeholder 250, respectively. The backside contact opening(s) 310 may be formed by a same or shared lithography and etch process. For example, a mask may be applied and patterned. An opening in the patterned mask may expose the portion of the underlying ILD 308 to be removed while other protected portions of semiconductor IC device 200 thereunder may be protected and retained. The dry and wet etching processes can have etching parameters that can be tuned, such as etchants used, etching temperature, etching solution concentration, etching pressure, source power, RF bias voltage, RF bias power, etchant flow rate, and other suitable parameters and selective materials are utilized to promote the etchant for desired ILD 308 material removal.

For clarity, in some examples as depicted, there are some instances where backside contact(s) are not formed in conjunction with an associated backside contact placeholder 250. In this example, it may be desirable for the backside contact placeholder 250 to be maintained in these sites. Particularly, for example, to reduce propensity of shorting between a particular backside contact and an adjacent replacement gate structure 260, it may be desirable to maintain the backside contact placeholders 250 that are located immediately adjacent to the replacement gate structure 260.

Figure 18:
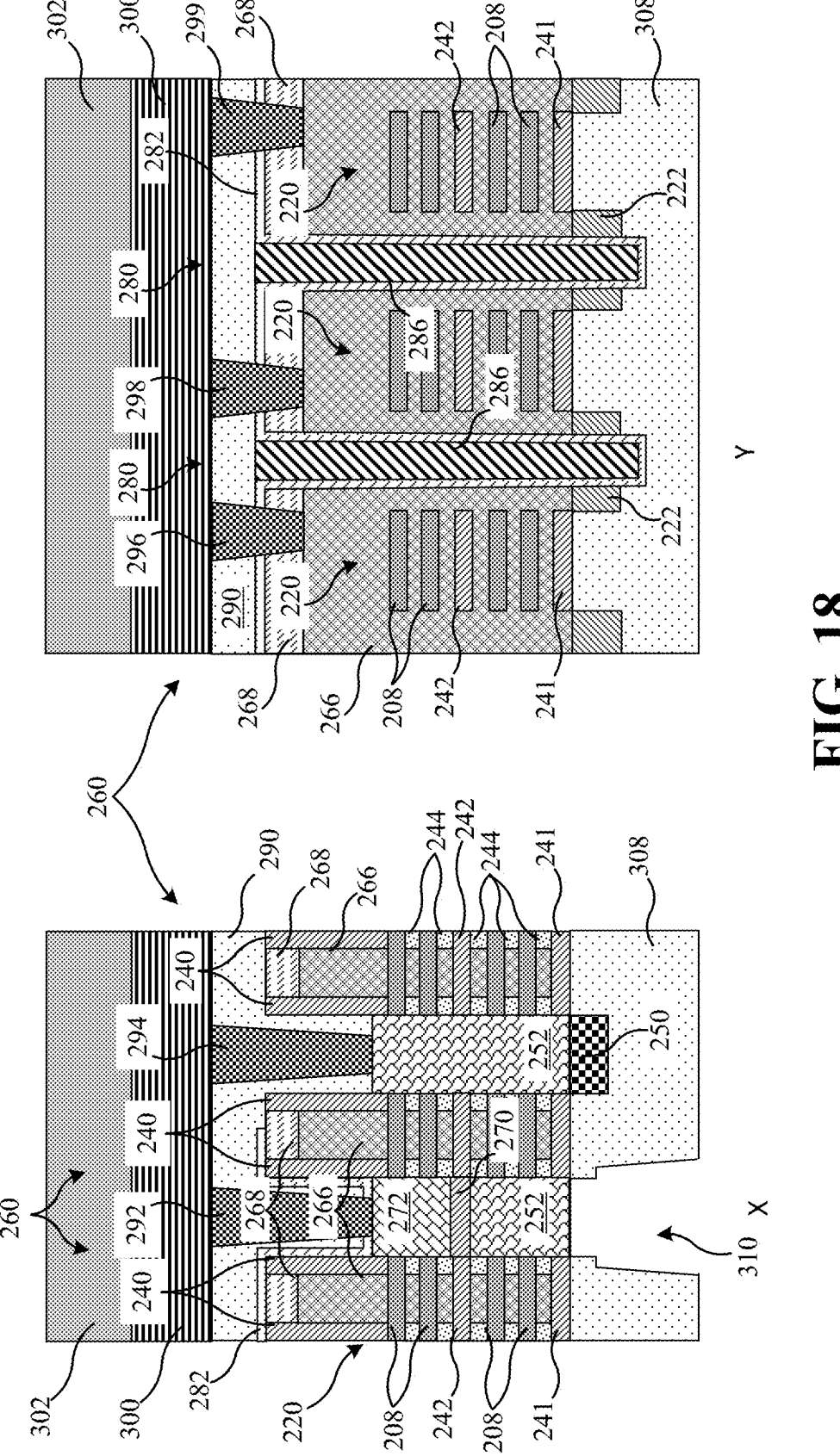

FIG. 18 depicts cross-sectional views of semiconductor IC device 200 shown after exemplary fabrication operation(s), in accordance with one or more embodiments. In the depicted fabrication stage, the backside contact placeholders 250 that are exposed by respective backside contact opening(s) 310 are removed. Upon removal of the backside contact placeholders 250 by a substrative removal technique, such as an etch, a selective etch, or the like, the S/D region 252 there above (as depicted) is at least partially exposed. For example, the bottom surface (as depicted) of one or more S/D regions 252 are exposed.

Figure 19:
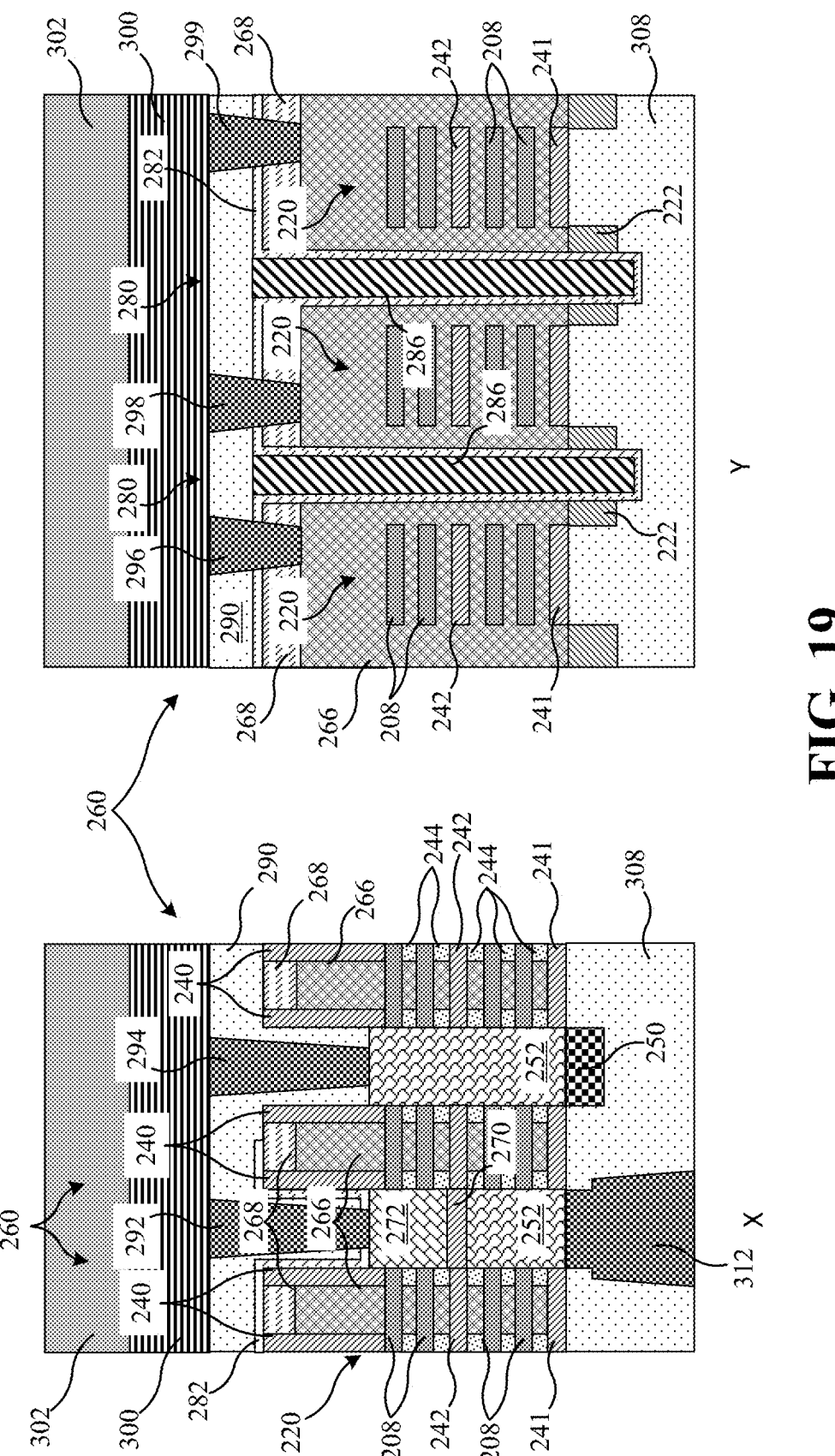

FIG. 19 depicts cross-sectional views of semiconductor IC device 200 shown after exemplary fabrication operation (s), in accordance with one or more embodiments. In the depicted fabrication stage, one or more backside contacts 312 are formed. The backside contact(s) 312 may be formed in contact with or melded against the exposed respective portion of the S/D region 252 there above (as depicted).

The backside contact(s) 312 may be formed by depositing conductive material, such as metal, into the respective backside contact openings. In an example, the backside contact(s) 312 may be formed by depositing a silicide liner, such as Ni, NiPt or Ti, etc. into the backside contact openings, depositing a metal adhesion liner, such as TiN, TaN, etc. upon the silicide liner, and by depositing a conductive metal fill, such as Al, Ru, W, Co, Cu, etc. upon the metal adhesion liner. Subsequently, a planarization process, such as a CMP process or a mechanical grinding process, may remove excess portions of the conductive barrier layer and the conductive material. Subsequently, the respective bottom surfaces (as depicted) of backside contact(s) 312 and ILD 308 may be coplanar.

For clarity, various semiconductor IC devices are depicted in the drawings to show exemplary relationships between n-type S/D region(s), p-type S/D region(s), frontside contacts that are connected thereto, and/or backside contacts that are connected thereto. The fabrication stages depicted to fabricate semiconductor IC device 200, may be used to fabricate semiconductor device 100 where the bottom short S/D region is the n-type S/D region 108, where the top short S/D region is the p-type S/D region 106, where the tall S/D region is the n-type S/D region 110, where the frontside contact 118 is connected to the p-type S/D region 106, where the frontside contact 120 is connected to the n-type S/D region 110, and where the backside contact 122 is connected to the n-type S/D region 108.

Figure 21B:
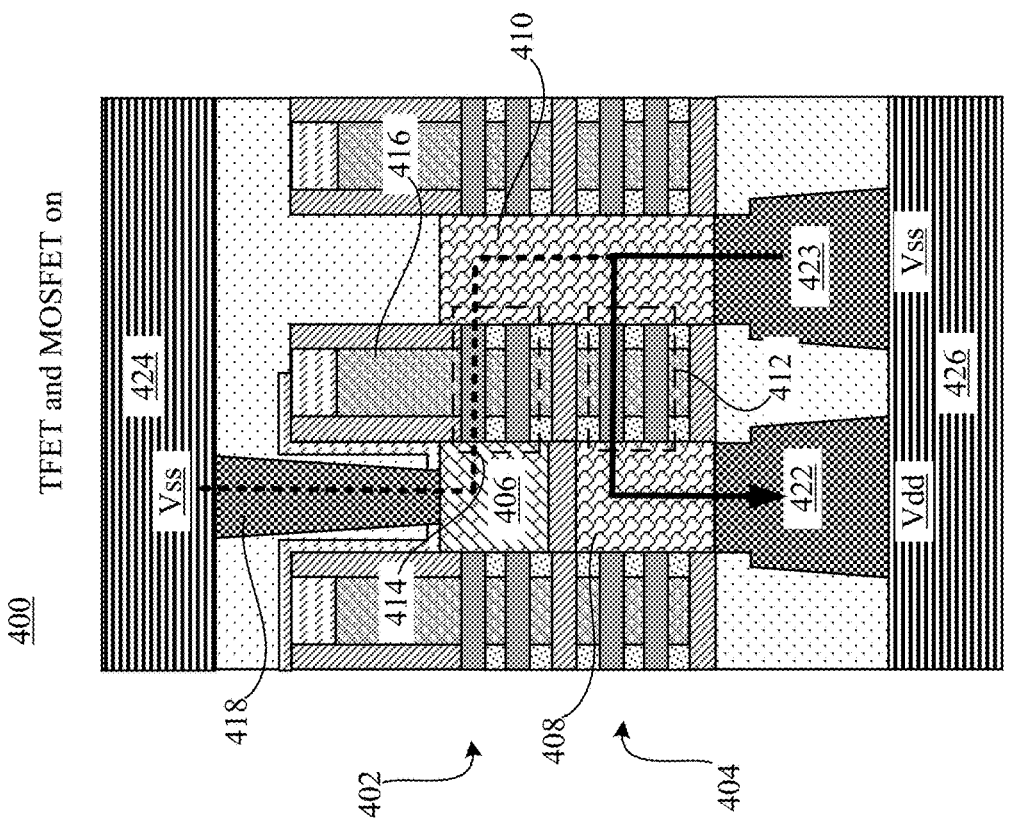
FIG. 21A and FIG. 21B depict a semiconductor IC device that includes a stacked TFET and a MOSFET, in accordance with one or more embodiments of the disclosure.
Figure 21A:
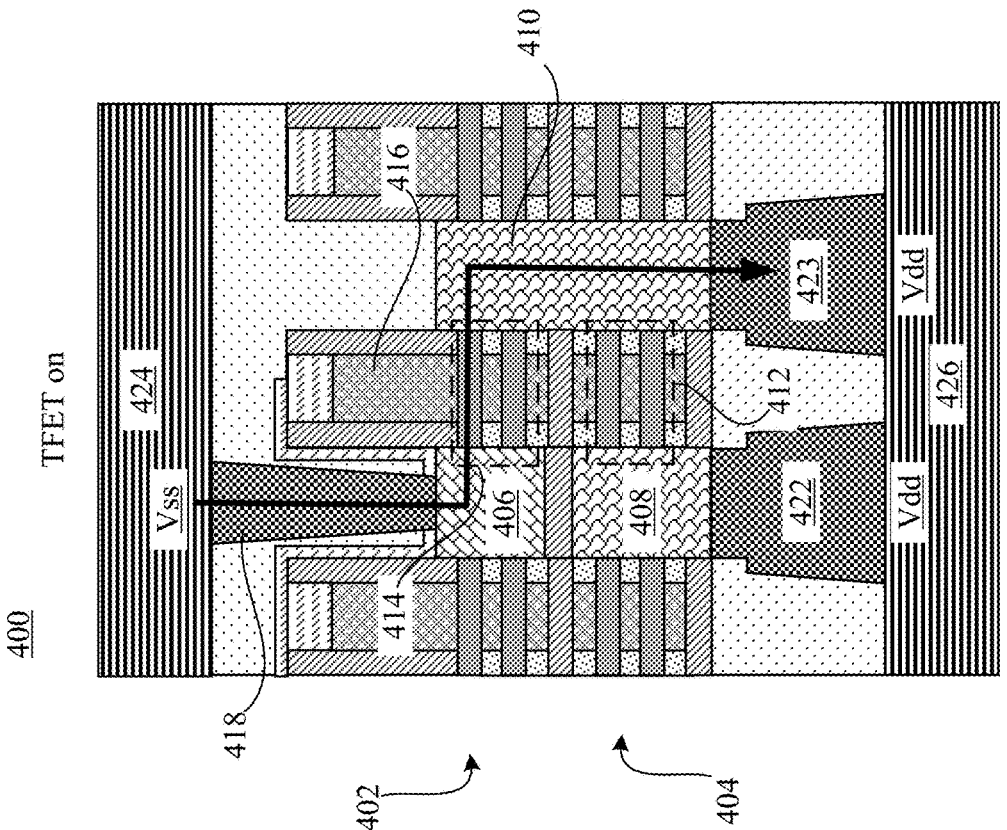

Similarly, the fabrication stages depicted to fabricate semiconductor IC device 200, may be used to fabricate semiconductor device 400, depicted in FIG. 21A, where the bottom short S/D region is the n-type S/D region 408, where the top short S/D region is the p-type S/D region 406, where the tall S/D region is the n-type S/D region 410, where the frontside contact 418 is connected to the p-type S/D region 406, where the backside contact 423 is connected to the n-type S/D region 410, and where the backside contact 422 is connected to the n-type S/D region 408.

Figure 22B:
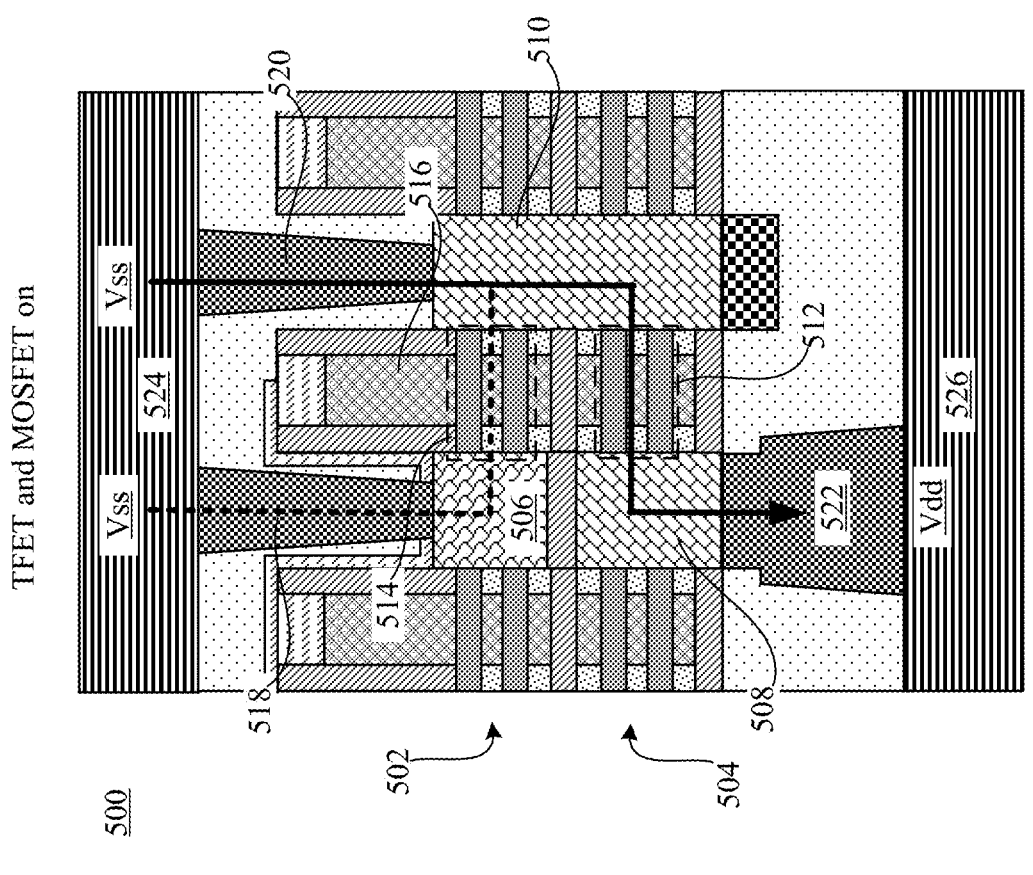
FIG. 22A and FIG. 22B depict a semiconductor IC device that includes a stacked TFET and a MOSFET, in accordance with one or more embodiments of the disclosure.
Figure 22A:
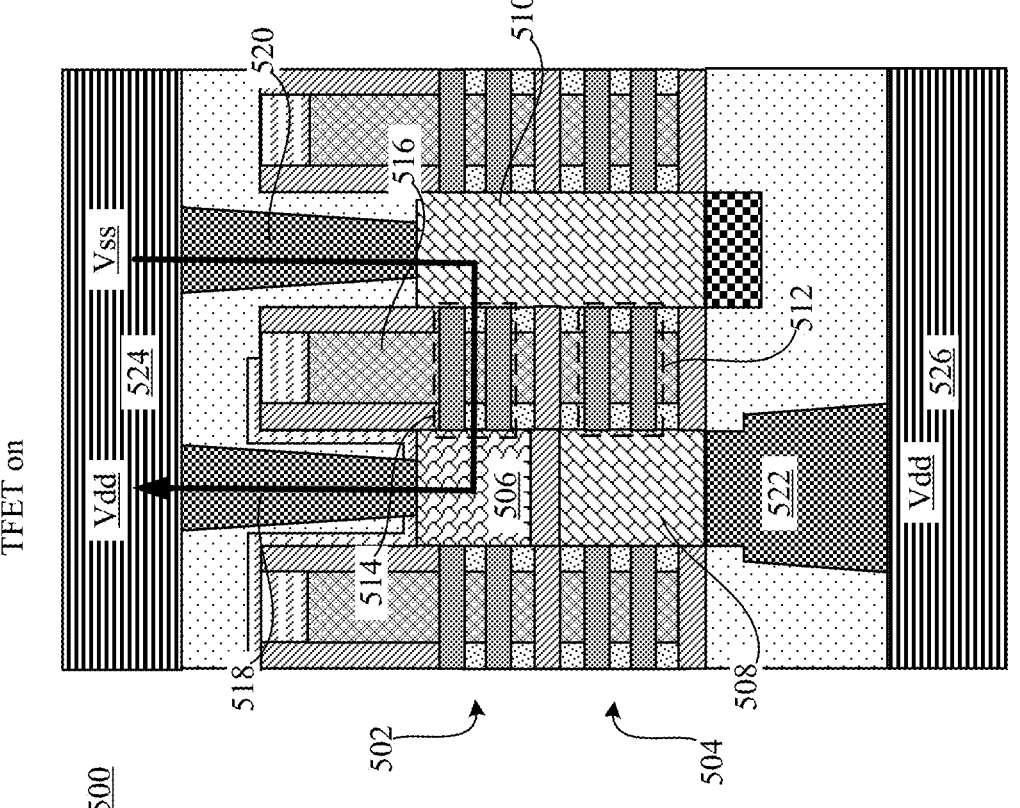

Similarly, the fabrication stages depicted to fabricate semiconductor IC device 200, may be used to fabricate semiconductor device 500, depicted in FIG. 22A, where the bottom short S/D region is the p-type S/D region 508, where the top short S/D region is the n-type S/D region 506, where the tall S/D region is the p-type S/D region 510, where the frontside contact 518 is connected to the n-type S/D region 506, where the backside contact 522 is connected to the p-type S/D region 508, and where the frontside contact 520 is connected to the p-type S/D region 510.

Likewise, the fabrication stages depicted to fabricate semiconductor IC device 200, may be used to fabricate semiconductor IC device 600, depicted in FIG. 22A, where the bottom short S/D region is the p-type S/D region 608, where the top short S/D region is the n-type S/D region 606, where the tall S/D region is the p-type S/D region 610, where the frontside contact 618 is connected to the n-type S/D region 606, where the backside contact 622 is connected to the p-type S/D region 508, and where the backside contact 623 is connected to the p-type S/D region 610.

Figure 20:
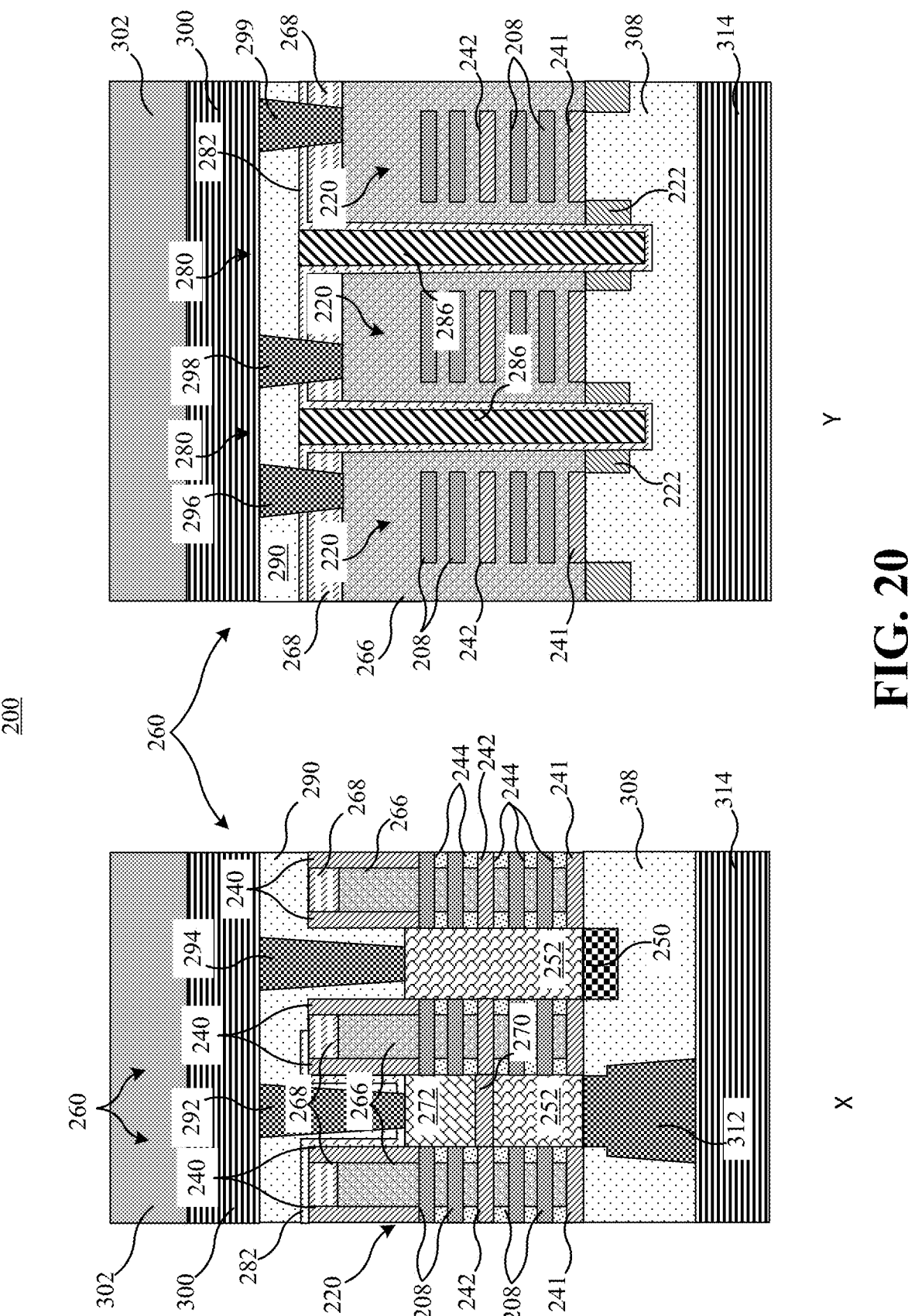

FIG. 20 depicts cross-sectional views of semiconductor IC device 200 shown after exemplary fabrication operation(s), in accordance with one or more embodiments. In the depicted fabrication stage, BSPDN 314 is formed upon the backside contact(s) 312 and upon the ILD 308.

BSPDN 314 includes conductive power rails within different metallization levels, associated metallization dielectric or passivation layers, vertical vias that connect predetermined power rails within the metallization levels with an above device or structure, and/or the like. In some examples, there may be five metal levels M0-M4 within BSPDN 314. In some examples, there may be more than ten metal levels M0-Mx within BSPDN 314. In some examples, backside contact(s) 312 may contact and connect the respective S/D region 252 there above to a power rail via, a power rail, or the like, located within the lowest BSPDN metal level M0.

Generally, the BSPDN 314 is located on the backside of the semiconductor IC device 200. In other words, BSPDN 314 is located on the opposite facing side of the semiconductor IC device 200 relative to frontside BEOL network 300.

Referring to FIG. 21A and to FIG. 21B which depicts semiconductor IC device 400 that includes a TFET 402 and a MOSFET 404, in accordance with one or more embodiments of the disclosure. Semiconductor IC device 400 is like semiconductor IC device 100 in that the bottom short S/D region is a p-type S/D region, the top short S/D region is an n-type region, and the tall S/D region is an n-type S/D region. However, semiconductor IC device 400 utilizes a backside contact to contact the tall S/D region as opposed to a frontside contact, which is utilized by semiconductor IC device 400.

The TFET 402 includes an p-type source/drain (S/D) 406 and a channel region 414. The MOSFET 404 includes an n-type S/D 408 and channel region 412. The TFET 402 and the MOSFET 404 share the same n-type S/D 410. That is, both the channel region 414 and the channel region 412 may be connected to the same n-type S/D 410. Similarly, TFET 402 and the MOSFET 404 may share the same gate 416. That is, both the channel region 414 and the channel region 412 may be connected to the same gate 416.

The p-type S/D 406 may be a different material type (i.e., p-type, n-type, or the like) relative to the n-type S/D 410.

Similarly, the n-type S/D 408 may be the same material type relative to the n-type S/D 410. The p-type S/D 406 and the n-type S/D 408 may be vertically stacked (e.g., the p-type S/D 406 is above the n-type S/D 408, as depicted). The p-type S/D 406 and the n-type S/D 408 may be vertically stacked (e.g., the p-type S/D 406 is above the n-type S/D 408 and at least a portion of the p-type S/D 406 is within a perimeter footprint of the n-type S/D 408). The p-type S/D 406 and the n-type S/D 408 may be vertically aligned (e.g., the p-type S/D 406 is above the S/D 408 and shares the same vertical bisector, as depicted). A S/D isolator may be between the p-type S/D 406 and the n-type S/D 408. The S/D isolator may adequately electrically isolate the p-type S/D 406 from the n-type S/D 408, and/or vice versa.

The semiconductor IC device 400 may further include a frontside contact 418, a backside contact 422, a backside contact 423, a frontside back end of the line (BEOL) network 424, and/or a BSPDN 426. The frontside contact 418 may directly connect the frontside BEOL network 424 to the p-type S/D 406. The backside contact 423 may directly connect the BSPDN 426 to the n-type S/D 410. The backside contact 422 may directly connect the BSPDN 426 to the n-type S/D 408. Generally, a threshold voltage of TFET 402 may be less than a threshold voltage of MOSFET 404.

FIG. 21A depicts exemplary current flow through the TFET 402 when a relatively low potential is applied to the gate 416. In this example, when the relatively low potential is applied to the gate 416, current may not flow through the MOSFET 404 and may solely flow through the TFET 402. In the depicted example, the frontside contact 418 may be at Vss potential, the backside contact 422 may be at Vdd potential, and the backside contact 423 may be at Vdd potential.

FIG. 21B depicts exemplary current flow through the MOSFET 404 when a relatively high potential is applied to the gate 416. In this example, when the relatively high potential is applied to the gate 416, current may flow through both the TFET 402 (shown by the dashed line) and through the MOSFET 404 (shown by the continuous line). In the depicted example, the frontside contact 418 may be at Vss potential, the backside contact 422 may be at Vdd potential, and the backside contact 423 may be at Vss potential.

Referring to FIG. 22A and to IC device 500 that includes a TFET 502 and a MOSFET 504, in accordance FIG. 22B which depicts semiconductor with one or more embodiments of the disclosure. Semiconductor IC device 500 is like semiconductor IC device 100 in that a respective frontside contact connects with the top short S/D region and the tall S/D region and a backside contact connects with the bottom short S/D region. However, semiconductor IC device 500 utilizes respective p-type S/D regions for the bottom short S/D region and for the tall S/D region and a n-type S/D region for the top short S/D region.

The TFET 502 includes an n-type source/drain (S/D) 506 and a channel region 514. The MOSFET 504 includes a p-type S/D 508 and channel region 512. The TFET 502 and the MOSFET 504 may share the same p-type S/D 510. That is, both the channel region 514 and the channel region 512 may be connected to the same p-type S/D 510. Similarly, TFET 502 and the MOSFET 504 may share the same gate 516. That is, both the channel region 514 and the channel region 512 may be connected to the same gate 516.

The n-type S/D 506 may be a different material type (i.e., p-type, n-type, or the like) relative to the p-type S/D 510. Similarly, the p-type S/D 508 may be the same material type relative to the p-type S/D 510. The n-type S/D 506 and the p-type S/D 508 may be vertically stacked, vertically stacked and aligned, or the like. A S/D isolator may be between the n-type S/D 506 and the p-type S/D 508. The S/D isolator may adequately electrically isolate the n-type S/D 506 from the p-type S/D 508, and/or vice versa.

The semiconductor IC device 500 may further include a frontside contact 518, a frontside contact 520, a backside contact 522, a frontside back end of the line (BEOL) network 524, and/or a BSPDN 526. The frontside contact 518 may directly connect the frontside BEOL network 524 to the n-type S/D 506. The frontside contact 520 may directly connect the frontside BEOL network 524 to the p-type S/D 510. The backside contact 522 may directly connect the BSPDN 526 to the p-type S/D 508. Generally, a threshold voltage of TFET 502 may be less than a threshold voltage of MOSFET 504.

FIG. 22A depicts exemplary current flow through the TFET 502 when a relatively low potential is applied to the gate 516. In this example, when the relatively low potential is applied to the gate 516, current may not flow through the MOSFET 504 and may solely flow through the TFET 502. In the depicted example, the frontside contact 518 may be at Vdd potential, the frontside contact 520 may be at Vss potential, and the backside contact 522 may be at Vdd potential.

FIG. 22B depicts exemplary current flow through the MOSFET 504 when a relatively high potential is applied to the gate 516. In this example, when the relatively high potential is applied to the gate 516, current may flow through both the TFET 502 (shown by the dashed line) and through the MOSFET 504 (shown by the continuous line). In the depicted example, the frontside contact 518 may be at Vss potential, the frontside contact 520 may be at Vss potential, and the backside contact 522 may be at Vdd potential.

Figures 23A, 23B:
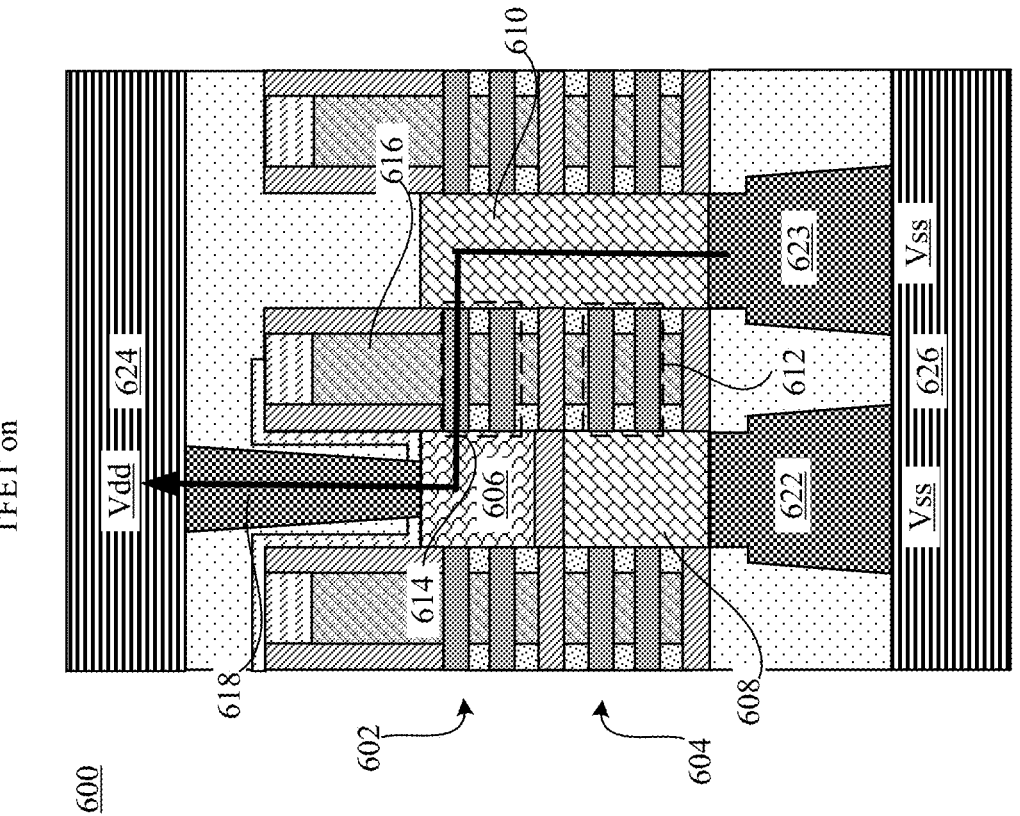
FIG. 23A and FIG. 23B depict a semiconductor IC device that includes a stacked TFET and a MOSFET, in accordance with one or more embodiments of the disclosure.

Referring to FIG. 23A and to FIG. 23B which depicts semiconductor IC device 600 that includes a TFET 602 and a MOSFET 604, in accordance with one or more embodiments of the disclosure. Semiconductor IC device 600 is like semiconductor IC device 500 in the arrangement of the p-type and n-type S/D regions. However, semiconductor IC device 600 utilizes a backside contact to contact the tall S/D region as opposed to a frontside contact, which is utilized by semiconductor IC device 500.

The TFET 602 includes an n-type source/drain (S/D) 606 and a channel region 614. The MOSFET 604 includes an p-type S/D 608 and a channel region 612. The TFET 602 and the MOSFET 604 share the same p-type S/D 610. That is, both the channel region 614 and the channel region 612 may be connected to the same p-type S/D 610. Similarly, TFET 602 and the MOSFET 604 may share the same gate 616. That is, both the channel region 614 and the channel region 612 may be connected to the same gate 616.

The n-type S/D 606 may be a different material type (i.e., p-type, n-type, or the like) relative to the p-type S/D 610. Similarly, the p-type S/D 608 may be the same material type relative to the p-type S/D 610. The n-type S/D 606 and the p-type S/D 608 may be vertically stacked, vertically stacked and aligned, or the like. An S/D isolator may be between the n-type S/D 606 and the p-type S/D 608. The S/D isolator may adequately electrically isolate the n-type S/D 606 from the p-type S/D 608, and/or vice versa.

The semiconductor IC device 600 may further include a frontside contact 618, a backside contact 622, a backside contact 623, a frontside back end of the line (BEOL) network 624, and/or a BSPDN 626. The frontside contact 618 may directly connect the frontside BEOL network 624 to the n-type S/D 606. The backside contact 623 may directly connect the BSPDN 626 to the p-type S/D 610. The backside contact 622 may directly connect the BSPDN 626 to the p-type S/D 608. Generally, a threshold voltage of TFET 602 may be less than a threshold voltage of MOSFET 604.

FIG. 23A depicts exemplary current flow through the TFET 602 when a relatively low potential is applied to the gate 616. In this example, when the relatively low potential is applied to the gate 616, current may not flow through the MOSFET 604 and may solely flow through the TFET 602. In the depicted example, the frontside contact 618 may be at Vdd potential, the backside contact 622 may be at Vss potential, and the backside contact 623 may be at Vss potential.

FIG. 23B depicts exemplary current flow through the MOSFET 604 when a relatively high potential is applied to the gate 616. In this example, when the relatively high potential is applied to the gate 616, current may flow through both the TFET 602 (shown by the dashed line) and through the MOSFET 604 (shown by the continuous line). In the depicted example, the frontside contact 618 may be at Vss potential, the backside contact 622 may be at Vdd potential, and the backside contact 623 may be at Vss potential.

The semiconductor IC devices disclosed herein may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

For clarity, the S/D region 108, S/D region 408, S/D region 508, S/D region 608, or the like may be referred herein as exemplary instances of a bottom short S/D region since such S/D regions are vertically below the S/D region 106, S/D region 406, S/D region 506, S/D region 606, respectively, and have a vertical dimension that is less that of S/D region 110, S/D region 410, S/D region 510, S/D region 610, respectively.

Similarly, the S/D region 106, S/D region 406, S/D region 506, S/D region 606, or the like may be referred herein as exemplary instances of a top short S/D region since such S/D regions are vertically above the S/D region 108, S/D region 408, S/D region 508, S/D region 608, respectively, and have a vertical dimension that is less that of S/D region 110, S/D region 410, S/D region 510, S/D region 610, respectively.

Similarly, the S/D region 110, S/D region 410, S/D region 510, S/D region 610, or the like may be referred herein as exemplary instances of a tall S/D region since such S/D regions have a vertical dimension that is greater that of the bottom short S/D regions and the top short S/D regions.

The short S/D regions may be vertically shorter than the tall S/D region because the short S/D regions are connected to a lesser number of vertically stacked channels. For example, the bottom short S/D region and the top short S/D region may be connected to two different vertically stacked channels, respectively, and the tall S/D region may be connected to four different vertically stacked channels, as is exemplarily depicted.

FIG. 24 depicts a flow diagram illustrating method 700 to fabricate semiconductor IC device that includes a MOSFET and TFET, according to one or more embodiments of the present disclosure. The depicted fabrication operations of method 700 are illustrated and described above with reference to one or more of FIG. 2 through FIG. 20 of the drawings. The method 700 depicted herein is exemplary. There can be many variations to the diagram or operations described therein without departing from the spirit of the embodiments. For instance, the operations can be performed in a differing order, or operations can be added, deleted, or modified. For instance, method 700 is described herein with reference to the fabrication of semiconductor IC device 200, through method 700 may be utilized to fabricate other semiconductor IC devices with similar or like features relative to the semiconductor IC device 100, 200, 400, 500, and/or 600 described and depicted herein.

At block 702, method 700 may begin with forming nanolayers upon a substrate, patterning the nanolayers into one or more nanolayer stacks, and forming shallow trench isolation (STI) regions. For example, method 700 may include initially fabricating bottom sacrificial nanolayer 204, forming a first series of alternating series of sacrificial nanolayers 206 and active nanolayers 208 upon bottom sacrificial nanolayer 204, forming a middle sacrificial nanolayer 210, and forming a second series of alternating series of sacrificial nanolayers 206 and active nanolayers 208 upon middle sacrificial nanolayer 210. Further, method 700 may include pattering the nanolayers to form one or more nanolayer stacks 220. Further in method 700, portions of the substrate between the nanolayer stacks 220 may be partially removed and a dielectric or isolation material may be deposited therein to form STI regions 222.

At block 704, method 700 may further continue with forming one or more sacrificial gate structure(s), with forming one or more gate spacers upon the one or more sacrificial gate structure(s), with forming a bottom dielectric isolation, and with forming a middle dielectric isolation. Method 700 may include forming one or more sacrificial gate structures 234 upon the substrate, upon the STI regions, and upon and around the nanolayer stacks 220. Next, method 700 may include removing bottom sacrificial nanolayer 204 and middle sacrificial nanolayer 210. Further, method 700 may include forming isolation material upon the substrate, upon the STI regions, upon the sidewall(s) of the sacrificial gate structures 234, and within the cavities formed by the removal of bottom sacrificial nanolayer 204 and middle sacrificial nanolayer 210. This isolation material may form spacers 240, bottom dielectric isolation 241, and middle dielectric isolation 242.

At block 706, method 700 may further continue with recessing the nanolayer stacks, with indenting the sacrificial nanolayers within the nanolayer stacks, and with forming a respective inner spacer within the recesses or indent. For example, method 700 may include forming S/D recesses 249 within the nanolayer stacks 220 between spacers 240 associated with neighboring sacrificial gate structures 234. Further, method 700 may include indenting the sacrificial nanolayers 206 within nanolayer stacks 220, thereby forming an indent void. Method 700 may further include forming an inner spacer 244 within a respective indent void.

At block 708, method 700 may further continue with forming one or more backside contact placeholder openings, with forming a backside contact placeholder within a respective backside contact placeholder opening, with forming one or more bottom S/D structures, and with forming a sacrificial ILD. For example, method 700 may include forming or more backside contact placeholders 250 within upper substrate 202 generally between neighboring sacrificial gate structures 234 within a source/drain region. In one example, the one or more backside contact placeholders 250 may be formed only in locations in which a backside contact is to be formed. In an alternative example, the one or more backside contact placeholders 250 may be formed in location(s) in which a backside contact is to be formed and in location(s) where a backside contact is not to be formed in association therewith.

Further, method 700 may include forming a S/D region 252 upon a respective backside contact placeholder 250. Still further, method 700 may include forming sacrificial dielectric 254 upon S/D region(s) 252 and upon STI regions 222.

At block 710, method 700 may continue with removing the one or more sacrificial gate structure(s), with removing the sacrificial nanolayers, and with forming a replacement gate structure within the void or recess formed by the absence of a respective sacrificial gate structure. For example, method 700 may include removing the sacrificial gate structures 234, with removing the sacrificial nanolayers 206, and forming a respective replacement gate structure 260 in place of the removed respective sacrificial gate structure 234.

At block 712, method 700 may continue with removing the sacrificial ILD, with forming a S/D isolation region upon the bottom S/D regions, and with forming a top S/D region above a respective S/D isolation region. For example, method 700 may include removing the sacrificial dielectric 254 by a subtractive removal technique such as a dry and/or wet etch. Still further, method 700 may include forming one or more S/D isolation region(s) 270 by depositing a dielectric material, such as a hard mask material, such as silicon nitride, silicon oxide, combinations thereof, or the like, upon respective S/D region 252. Still further, method 700 may continue with forming S/D regions 272 by epitaxially growing epitaxial material from upon respective sidewalls or end surfaces of the active nanolayers 208 that are above the one or more S/D isolation region(s) 270 within the source/drain region between neighboring replacement gate structures 260.

At block 714, method 700 may continue with forming one or more gate cut openings within the replacement gate structure(s), with lining the one or more gate cut openings with a liner or dielectric layer, and with forming and patterning a mask. For example, method 700 may include forming the one or more gate cut trenches 280 by removing portion(s) of the replacement gate structures 260 (e.g., gate cap 268, replacement gate fill 266, or the like) that are between active regions and/or that are between nanolayer stacks 220. Still further, method 700 may continue with forming liner 282 upon the one or more spacers 240, the one or more gate caps 268, the one or more S/D regions 272, and upon the inner surfaces of the one or more gates cut trenches 280 (e.g., gate cut formed sidewalls of gate cap 268, replacement gate fill 266, STI regions 222, etch stop layer 203, and the upper surface of lower substrate 201). Still further, the mask 284 may be formed by depositing a blanket mask layer, consisting of a dielectric material or other mask material, upon the liner 282 and patterned by lithography techniques. In an example, an opening in the mask 284 may expose a first S/D region 272 while a second S/D region 272 is protected by the patterned mask 284.

At block 716, method 700 may continue with removing a first top S/D region and underlying first S/D isolation region, with further forming, thickening, or otherwise enlarging a first bottom S/D region that is exposed by the removal of the first top S/D region and underlying first S/D isolation region, with forming a gate cut filler within the one or more gate cut openings, and with forming an interlayer dielectric. For example, method 700 may include, using the mask 284 to protect the second S/D region 272 and S/D region 252 there below, removing the first S/D region 272 and a first S/D isolation region 270 there below by an appropriate substractive removal technique, such as an etch. Subsequently, the mask 284 may be removed by a subtractive removal technique, such as an etch, OPL ash, or the like.

Still further, method 700 may include enlarging the exposed first S/D region 252 by epitaxially growing material upon the exposed portion (e.g., top surface, etc.) of the first S/D region 252 within the source/drain region between neighboring replacement gate structures 260. Still further, method 700 may include forming ILD 290 upon a retained portion of liner 282 and upon the enlarged first S/D region 252 and forming gate cut fill 286 instances upon the liner 282 within a respective gate cut trench 280. In one example, the one or more gate cut fill 286 instances and the ILD 290 are the same material and may be formed with during the same blanket dielectric material deposition stage.

At block 718, method 700 may continue with MOL contact formation, with frontside BEOL network formation, and with bonding a carrier wafer thereto. For example, method 700 may include forming a respective frontside contact 292 upon S/D region 272, forming a respective frontside contact 294 upon enlarged S/D region 252, forming a respective frontside contact 296, 298, and/or 299 upon a respective replacement gate structure instance. As is depicted by the various semiconductor IC devices described herein, the S/D regions may be contacted by a frontside contact or backside contact. If the S/D region is to be contacted by the frontside contact, then frontside contacts are formed in association with block 718. If the S/D region is to be contacted by the backside contact, then the frontside contact need not be fabricated in association with block 718, as is applicable or desired. In one implementation, a particular S/D region may be contacted by either a frontside contact or a backside contact. In other implementations, the particular S/D region may be contacted by both a frontside contact and a backside contact.

Further, method 700 may include forming frontside BEOL network 300 upon the ILD 290 and upon the frontside contacts 292, 294, 296, 298, and/or 299. Still further, method 700 may include bonding carrier wafer 302 to the frontside BEOL network 300.

At block 720, method 700 may continue with flipping the wafer assembly, with removing the substrate from the backside to expose the one or more backside contact placeholders 250. For example, method 700 may include flipping semiconductor IC device using the carrier wafer 302 and removing lower substrate 201. Further, method 700 may include removing etch stop layer 203 and the upper substrate 202 to expose backside placeholders 250 and to expose the bottom dielectric isolation 242 instances.

At block 722, method 700 may continue with forming a backside ILD, with patterning the backside ILD to form one or more backside contact trenches in predetermined locations so as to form one or more backside contacts, with removing one or more of the backside contact placeholder structures associated therewith, with forming a backside contact within the one or more backside contact trenches, and with forming the BSPDN. For example, method 700 may include forming ILD 308 upon the exposed replacement gate structure(s) 260, the exposed backside placeholders 250, and the exposed bottom dielectric isolation 241 instances.

Still further, method 700 may include forming backside contact opening 310 within the ILD 308. The formation of backside contact opening 310 may expose a respective backside contact placeholder 250 which may be subsequently removed by a substrative removal technique, such as an etch. Upon removal of the backside contact placeholders 250, the S/D region associated therewith is at least partially exposed. Multiple backside contact openings 310 may be formed in the predetermined locations so as to form respective backside contacts associated therewith. For example, when fabricating semiconductor structure 100 a backside contact opening 310 is formed in a location so as to form backside contact 122, when fabricating semiconductor structure 400 multiple backside contact openings 310 are formed in respective locations so as to form backside contacts 422, 423, etc.

Still further, method 700 may include forming backside contact 312 within backside contact opening 310. The backside contact 312 may be formed in contact with or melded against the exposed portion of the S/D region associated therewith. Still further, method 700 may include forming BSPDN 314 upon the ILD 308 and upon the backside contact(s) 312. Method 700 may further include removing the carrier wafer 302 and other subsequent fabrication stages to, for example, fabricate an IC chip, an end product, or the like.

The descriptions of the various embodiments of the present disclosure have been presented for purposes of illustration but are not intended to be exhaustive or limited to the embodiments described. Many modifications and variations will be apparent to those of ordinary skill in the art without departing from the scope and spirit of the disclosure. The terminology used herein was chosen to best explain the principles of the embodiment, the practical application or technical improvement over technologies found in the marketplace, or to enable others of ordinary skill in the art to understand the embodiments described herein.

Various embodiments of the present disclosure are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, ±2%, or the like, difference between the coplanar materials.

As used herein, the term "coplanar" refers to two surfaces that lie in a common plane. In other words, two surfaces are coplanar if there exists a geometric plane that contains all of the points of both of the surfaces. As used herein, the term "substantially" refers to an extent to which minor deviations are included such that the deviations do not impact the desired result. Accordingly, two surfaces may be referred to as substantially coplanar despite deviations from coplanarity on an atomic scale, so long as those deviations do not impact the desired result of the coplanarity."

What is claimed is:

1. A hybrid transistor structure comprising:
   a complementary metal oxide semiconductor field effect transistor (MOSFET) comprising first nanolayer channels;
   a first source/drain connected to the first nanolayer channels;
   a tunneling field effect transistor (TFET) comprising second nanolayer channels wherein the TFET is vertically stacked and aligned above the MOSFET;
   a second source/drain connected to the second nanolayer channels;
   dielectric isolation region electrically isolating the first source/drain from the second source/drain; and
   a third source/drain connected both the first nanolayer channels and the second nanolayer channels.

2. The hybrid transistor structure of claim 1, wherein a first width of the first source/drain, a second width of the dielectric isolation region, and a third width of the second source/drain are all substantially equal to one another.

3. The hybrid transistor structure of claim 1, wherein a threshold voltage of the TFET is less than a threshold voltage of the MOSFET.

4. The hybrid transistor structure of claim 1, wherein the first source/drain is composed of an n-type material, wherein the second source/drain is composed of a p-type material, and wherein the third source/drain is composed of an n-type material.

5. The hybrid transistor structure of claim 1, wherein the first source/drain is composed of an p-type material, wherein the second source/drain is composed of a n-type material, and wherein the third source/drain is composed of an p-type material.

6. The hybrid transistor structure of claim 1, wherein a topmost surface of the second source/drain is substantially flush with a topmost surface of the third source/drain, and wherein a bottommost surface of the first source/drain is substantially flush with a bottommost surface of the third source/drain.

7. The hybrid transistor structure of claim 1, further comprising:

a shared gate surrounding one or more of the first nanolayer channels and one or more of the second nanolayer channels.

8. A hybrid transistor structure comprising:

a bottom gate all-around transistor comprising bottom nanolayer channels;

a first source/drain connected to the bottom nanolayer channels;

a top gate all-around transistor comprising top nanolayer channels wherein the top gate all-around transistor is vertically stacked and aligned above the bottom gate all-around transistor;

a second source/drain connected to the top nanolayer channels;

dielectric isolation region electrically isolating the first source/drain from the second source/drain;

a third source/drain connected both the bottom nanolayer channels and the top nanolayer channels; and a placeholder immediately below the third source/drain.

9. The hybrid transistor structure of claim 8, wherein a first width of the first source/drain, a second width of the dielectric isolation region, and a third width of the second source/drain are all substantially equal to one another.

10. The hybrid transistor structure of claim 8, wherein a threshold voltage of the bottom gate all-around transistor is less than a threshold voltage of the top gate all-around transistor.

11. The hybrid transistor structure of claim 8, wherein the first source/drain is composed of an n-type material, wherein the second source/drain is composed of a p-type material, and wherein the third source/drain is composed of an n-type material.

12. The hybrid transistor structure of claim 8, wherein the first source/drain is composed of an p-type material, wherein the second source/drain is composed of a n-type material, and wherein the third source/drain is composed of an p-type material.

13. The hybrid transistor structure of claim 8, wherein a topmost surface of the second source/drain is substantially flush with a topmost surface of the third source/drain, and wherein a bottommost surface of the first source/drain is substantially flush with a bottommost surface of the third source/drain.

14. The hybrid transistor structure of claim 8, further comprising:

a shared gate surrounding one or more of the bottom nanolayer channels and one or more of the top nanolayer channels.

15. A hybrid transistor structure comprising:

a top transistor vertically stacked and aligned above a bottom transistor;

a first source/drain connected to bottom nanolayer channels of the bottom transistor;

a second source/drain connected to top nanolayer channels of the top transistor;

a third source/drain connected both the bottom nanolayer channels and the top nanolayer channels; and a liner above and directly contacting a topmost surface of the second source/drain, wherein the liner physically separates from the second source/drain from an interlevel dielectric, and wherein the interlevel dielectric directly contacts a topmost surface of the third source/drain.

16. The hybrid transistor structure of claim 15, wherein a threshold voltage of the bottom transistor is less than a threshold voltage of the top transistor.

17. The hybrid transistor structure of claim 15, wherein the first source/drain is composed of an n-type material, wherein the second source/drain is composed of a p-type material, and wherein the third source/drain is composed of an n-type material.

18. The hybrid transistor structure of claim 15, wherein the first source/drain is composed of an p-type material, wherein the second source/drain is composed of a n-type material, and wherein the third source/drain is composed of an p-type material.

19. The hybrid transistor structure of claim 15, wherein a topmost surface of the second source/drain is substantially flush with a topmost surface of the third source/drain, and wherein a bottommost surface of the first source/drain is substantially flush with a bottommost surface of the third source/drain.

20. The hybrid transistor structure of claim 15, further comprising:

a shared gate surrounding one or more of the top nanolayer channels and one or more of the bottom nanolayer channels.

*  *  *  *  *